(12) United States Patent
Rothkopf et al.

(10) Patent No.: US 7,910,843 B2
(45) Date of Patent: Mar. 22, 2011

(54) COMPACT INPUT DEVICE

(75) Inventors: Fletcher Rothkopf, Cupertino, CA (US); Jan Moolsintong, Cupertino, CA (US); Joseph Fisher, Cupertino, CA (US); Wendell Sander, Cupertino, CA (US); Erturk Kocalar, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 244 days.

(21) Appl. No.: 12/204,401

(22) Filed: Sep. 4, 2008

(65) Prior Publication Data
US 2009/0058687 A1    Mar. 5, 2009

Related U.S. Application Data

(60) Provisional application No. 60/935,854, filed on Sep. 4, 2007.

(51) Int. Cl.
*H01H 9/00* (2006.01)
(52) U.S. Cl. ............. 200/5 R; 200/4; 200/6 A; 200/600; 345/173
(58) Field of Classification Search ............... 200/4, 5 R, 200/14, 6 A, 600; 341/20–22, 33–35; 345/156, 345/157, 161, 168, 169, 173, 184
See application file for complete search history.

(56) References Cited

U.S. PATENT DOCUMENTS

| | | | |
|---|---|---|---|
| 1,061,578 A | 5/1913 | Wischhusen et al. | |
| 2,063,276 A | 12/1936 | Thomas | |
| 2,798,907 A | 7/1957 | Schneider | |
| 2,903,229 A | 9/1959 | Landge | |
| 2,945,111 A | 7/1960 | McCormick | |
| 3,005,055 A | 10/1961 | Mattke | |
| 3,965,399 A | 6/1976 | Walker et al. | |
| 3,996,441 A | 12/1976 | Ohashi | |
| 4,103,252 A | 7/1978 | Bobick | |
| 4,110,749 A | 8/1978 | Janko et al. | |
| 4,115,670 A | 9/1978 | Chandler | |
| 4,121,204 A | 10/1978 | Welch et al. | |
| 4,129,747 A | 12/1978 | Pepper | |
| 4,158,216 A | 6/1979 | Bigelow | |
| 4,242,676 A | 12/1980 | Piguet et al. | |
| 4,246,452 A | 1/1981 | Chandler | |
| 4,264,903 A | 4/1981 | Bigelow | |
| 4,266,144 A | 5/1981 | Bristol | |
| 4,293,734 A | 10/1981 | Pepper, Jr. | |

(Continued)

FOREIGN PATENT DOCUMENTS

CN    1139235    1/1997

(Continued)

OTHER PUBLICATIONS

IPRP mailed Dec. 23, 2009, directed to corresponding application No. PCT/US2008/075212; 30 pages.

(Continued)

*Primary Examiner* — Michael A Friedhofer
(74) *Attorney, Agent, or Firm* — Morrison & Foerster LLP

(57) ABSTRACT

Compact input devices formed on flexible substrates are disclosed. The input devices may be formed using three or more conducting layers. By including three or more conducting layers, the diameter of the input device may be minimized. In addition, to improve the flexibility of portions of the input device mounted, some portions of the input device may be made to have fewer layers than other portions of the input device.

20 Claims, 16 Drawing Sheets

U.S. PATENT DOCUMENTS

| | | |
|---|---|---|
| D264,969 S | 6/1982 | McGourty |
| 4,380,007 A | 4/1983 | Steinegger |
| 4,380,040 A | 4/1983 | Posset |
| 4,475,008 A | 10/1984 | Doi et al. |
| 4,570,149 A | 2/1986 | Thornburg et al. |
| 4,583,161 A | 4/1986 | Gunderson et al. |
| 4,587,378 A | 5/1986 | Moore |
| 4,604,786 A | 8/1986 | Howie, Jr. |
| 4,644,100 A | 2/1987 | Brenner et al. |
| 4,719,524 A | 1/1988 | Morishima et al. |
| 4,734,034 A | 3/1988 | Maness et al. |
| 4,736,191 A | 4/1988 | Matzke et al. |
| 4,739,191 A | 4/1988 | Puar |
| 4,739,299 A | 4/1988 | Eventoff et al. |
| 4,752,655 A | 6/1988 | Tajiri et al. |
| 4,755,765 A | 7/1988 | Ferland |
| 4,764,717 A | 8/1988 | Tucker et al. |
| 4,798,919 A | 1/1989 | Miessler et al. |
| 4,810,992 A | 3/1989 | Eventoff |
| 4,822,957 A | 4/1989 | Talmage, Jr. et al. |
| 4,831,359 A | 5/1989 | Newell |
| 4,849,852 A | 7/1989 | Mullins |
| 4,856,993 A | 8/1989 | Maness et al. |
| 4,860,768 A | 8/1989 | Hon et al. |
| 4,866,602 A | 9/1989 | Hall |
| 4,876,524 A | 10/1989 | Jenkins |
| 4,897,511 A | 1/1990 | Itaya et al. |
| 4,914,624 A | 4/1990 | Dunthorn |
| 4,917,516 A | 4/1990 | Retter |
| 4,943,889 A | 7/1990 | Ohmatoi |
| 4,951,036 A | 8/1990 | Grueter et al. |
| 4,954,823 A | 9/1990 | Binstead |
| 4,976,435 A | 12/1990 | Shatford et al. |
| 4,990,900 A | 2/1991 | Kikuchi |
| 5,008,497 A | 4/1991 | Asher |
| 5,036,321 A | 7/1991 | Leach et al. |
| 5,053,757 A | 10/1991 | Meadows |
| 5,086,870 A | 2/1992 | Bolduc |
| 5,125,077 A | 6/1992 | Hall |
| 5,159,159 A | 10/1992 | Asher |
| 5,179,648 A | 1/1993 | Hauck |
| 5,186,646 A | 2/1993 | Pederson |
| 5,192,082 A | 3/1993 | Inoue et al. |
| 5,231,326 A | 7/1993 | Echols |
| 5,237,311 A | 8/1993 | Mailey et al. |
| 5,278,362 A | 1/1994 | Ohashi |
| 5,305,017 A | 4/1994 | Gerpheide |
| 5,313,027 A | 5/1994 | Inoue et al. |
| D349,280 S | 8/1994 | Kaneko |
| 5,339,213 A | 8/1994 | O'Callaghan |
| 5,367,199 A | 11/1994 | Lefkowitz et al. |
| 5,374,787 A | 12/1994 | Miller et al. |
| 5,379,057 A | 1/1995 | Clough et al. |
| 5,404,152 A | 4/1995 | Nagai |
| 5,408,621 A | 4/1995 | Ben-Arie |
| 5,414,445 A | 5/1995 | Kaneko et al. |
| 5,416,498 A | 5/1995 | Grant |
| 5,424,756 A | 6/1995 | Ho et al. |
| 5,432,531 A | 7/1995 | Calder et al. |
| 5,438,331 A | 8/1995 | Gilligan et al. |
| D362,431 S | 9/1995 | Kaneko et al. |
| 5,450,075 A | 9/1995 | Waddington |
| 5,453,761 A | 9/1995 | Tanaka |
| 5,473,343 A | 12/1995 | Kimmich et al. |
| 5,473,344 A | 12/1995 | Bacon et al. |
| 5,479,192 A | 12/1995 | Carroll, Jr. et al. |
| 5,494,157 A | 2/1996 | Golenz et al. |
| 5,495,566 A | 2/1996 | Kwatinetz |
| 5,508,703 A | 4/1996 | Okamura et al. |
| 5,543,588 A | 8/1996 | Bisset et al. |
| 5,543,591 A | 8/1996 | Gillespie et al. |
| 5,555,004 A | 9/1996 | Ono et al. |
| 5,559,301 A | 9/1996 | Bryan, Jr. et al. |
| 5,559,943 A | 9/1996 | Cyr et al. |
| 5,561,445 A | 10/1996 | Miwa et al. |
| 5,564,112 A | 10/1996 | Hayes et al. |
| 5,565,887 A | 10/1996 | McCambridge et al. |
| 5,578,817 A | 11/1996 | Bidiville et al. |
| 5,581,670 A | 12/1996 | Bier et al. |
| 5,585,823 A | 12/1996 | Duchon et al. |
| 5,589,856 A | 12/1996 | Stein et al. |
| 5,589,893 A | 12/1996 | Gaughan et al. |
| 5,596,347 A | 1/1997 | Robertson et al. |
| 5,596,697 A | 1/1997 | Foster et al. |
| 5,598,183 A | 1/1997 | Robertson et al. |
| 5,611,040 A | 3/1997 | Brewer et al. |
| 5,611,060 A | 3/1997 | Belfiore et al. |
| 5,613,137 A | 3/1997 | Bertram et al. |
| 5,617,114 A | 4/1997 | Bier et al. |
| 5,627,531 A | 5/1997 | Posso et al. |
| 5,632,679 A | 5/1997 | Tremmel |
| 5,640,258 A | 6/1997 | Kurashima et al. |
| 5,648,642 A | 7/1997 | Miller et al. |
| D382,550 S | 8/1997 | Kaneko et al. |
| 5,657,012 A | 8/1997 | Tait |
| 5,661,632 A | 8/1997 | Register |
| D385,542 S | 10/1997 | Kaneko et al. |
| 5,675,362 A | 10/1997 | Clough et al. |
| 5,689,285 A | 11/1997 | Asher |
| 5,721,849 A | 2/1998 | Amro |
| 5,726,687 A | 3/1998 | Belfiore et al. |
| 5,729,219 A | 3/1998 | Armstrong et al. |
| 5,730,165 A | 3/1998 | Philipp |
| 5,748,185 A | 5/1998 | Stephan et al. |
| 5,751,274 A | 5/1998 | Davis |
| 5,754,890 A | 5/1998 | Holmdahl et al. |
| 5,764,066 A | 6/1998 | Novak et al. |
| 5,777,605 A | 7/1998 | Yoshinobu et al. |
| 5,786,818 A | 7/1998 | Brewer et al. |
| 5,790,769 A | 8/1998 | Buxton et al. |
| 5,798,752 A | 8/1998 | Buxton et al. |
| 5,805,144 A | 9/1998 | Scholder et al. |
| 5,808,602 A | 9/1998 | Sellers |
| 5,812,239 A | 9/1998 | Eger |
| 5,812,498 A | 9/1998 | Terés |
| 5,815,141 A | 9/1998 | Phares |
| 5,825,351 A | 10/1998 | Tam |
| 5,825,352 A | 10/1998 | Bisset et al. |
| 5,825,353 A | 10/1998 | Will |
| 5,828,364 A | 10/1998 | Siddiqui |
| 5,838,304 A | 11/1998 | Hall |
| 5,841,078 A | 11/1998 | Miller et al. |
| 5,841,423 A | 11/1998 | Carroll, Jr. et al. |
| D402,281 S | 12/1998 | Ledbetter et al. |
| 5,850,213 A | 12/1998 | Imai et al. |
| 5,856,822 A | 1/1999 | Du et al. |
| 5,859,629 A | 1/1999 | Tognazzini |
| 5,861,875 A | 1/1999 | Gerpheide |
| 5,869,791 A | 2/1999 | Young |
| 5,875,311 A | 2/1999 | Bertram et al. |
| 5,883,619 A | 3/1999 | Ho et al. |
| 5,889,236 A | 3/1999 | Gillespie et al. |
| 5,889,511 A | 3/1999 | Ong et al. |
| 5,894,117 A | 4/1999 | Kamishima |
| 5,903,229 A | 5/1999 | Kishi |
| 5,907,152 A | 5/1999 | Dandliker et al. |
| 5,907,318 A | 5/1999 | Medina |
| 5,909,211 A | 6/1999 | Combs et al. |
| 5,910,802 A | 6/1999 | Shields et al. |
| 5,914,706 A | 6/1999 | Kono |
| 5,923,388 A | 7/1999 | Kurashima et al. |
| D412,940 S | 8/1999 | Kato et al. |
| 5,933,102 A | 8/1999 | Miller et al. |
| 5,933,141 A | 8/1999 | Smith |
| 5,943,044 A | 8/1999 | Martinelli et al. |
| 5,953,000 A | 9/1999 | Weirich |
| 5,956,019 A | 9/1999 | Bang et al. |
| 5,959,610 A | 9/1999 | Silfvast |
| 5,959,611 A | 9/1999 | Smailagic et al. |
| 5,964,661 A | 10/1999 | Dodge |
| 5,973,668 A | 10/1999 | Watanabe |
| 6,000,000 A | 12/1999 | Hawkins et al. |
| 6,002,389 A | 12/1999 | Kasser et al. |
| 6,005,299 A | 12/1999 | Hengst |
| 6,025,832 A | 2/2000 | Sudo et al. |
| 6,031,518 A | 2/2000 | Adams et al. |
| 6,034,672 A | 3/2000 | Gaultier et al. |

| | | | | | | | |
|---|---|---|---|---|---|---|---|
| 6,057,829 | A | 5/2000 | Silfvast | 6,639,584 | B1 | 10/2003 | Li |
| 6,075,533 | A | 6/2000 | Chang | 6,640,250 | B1 | 10/2003 | Chang et al. |
| 6,084,574 | A | 7/2000 | Bidiville | 6,650,975 | B2 | 11/2003 | Ruffner |
| D430,169 | S | 8/2000 | Scibora | D483,809 | S | 12/2003 | Lim |
| 6,097,372 | A | 8/2000 | Suzuki | 6,658,773 | B2 | 12/2003 | Rohne et al. |
| 6,104,790 | A | 8/2000 | Narayanaswami | 6,664,951 | B1 | 12/2003 | Fujii et al. |
| 6,122,526 | A | 9/2000 | Parulski et al. | 6,677,927 | B1 | 1/2004 | Bruck et al. |
| 6,124,587 | A | 9/2000 | Bidiville et al. | 6,678,891 | B1 | 1/2004 | Wilcox et al. |
| 6,128,006 | A | 10/2000 | Rosenberg et al. | 6,686,904 | B1 | 2/2004 | Sherman et al. |
| 6,131,048 | A | 10/2000 | Sudo et al. | 6,686,906 | B2 | 2/2004 | Salminen et al. |
| 6,141,068 | A | 10/2000 | Iijima | 6,703,550 | B2 | 3/2004 | Chu |
| 6,147,856 | A | 11/2000 | Karidis | 6,724,817 | B1 | 4/2004 | Simpson et al. |
| 6,163,312 | A | 12/2000 | Furuya | 6,727,889 | B2 | 4/2004 | Shaw |
| 6,166,721 | A | 12/2000 | Kuroiwa et al. | D489,731 | S | 5/2004 | Huang |
| 6,179,496 | B1 | 1/2001 | Chou | 6,738,045 | B2 | 5/2004 | Hinckley et al. |
| 6,181,322 | B1 | 1/2001 | Nanavati | 6,750,803 | B2 | 6/2004 | Yates et al. |
| D437,860 | S | 2/2001 | Suzuki et al. | 6,781,576 | B2 | 8/2004 | Tamura |
| 6,188,391 | B1 | 2/2001 | Seely et al. | 6,784,384 | B2 * | 8/2004 | Park et al. .................. 200/11 R |
| 6,188,393 | B1 | 2/2001 | Shu | 6,788,288 | B2 | 9/2004 | Ano |
| 6,191,774 | B1 | 2/2001 | Schena et al. | 6,791,533 | B2 | 9/2004 | Su |
| 6,198,054 | B1 | 3/2001 | Janniere | 6,795,057 | B2 | 9/2004 | Gordon |
| 6,198,473 | B1 | 3/2001 | Armstrong | D497,618 | S | 10/2004 | Andre et al. |
| 6,211,861 | B1 | 4/2001 | Rosenberg et al. | 6,810,271 | B1 | 10/2004 | Wood et al. |
| 6,219,038 | B1 | 4/2001 | Cho | 6,822,640 | B2 | 11/2004 | Derocher |
| 6,222,528 | B1 | 4/2001 | Gerpheide et al. | 6,834,975 | B2 | 12/2004 | Chu-Chia et al. |
| D442,592 | S | 5/2001 | Ledbetter et al. | 6,844,872 | B1 | 1/2005 | Farag et al. |
| 6,225,976 | B1 | 5/2001 | Yates et al. | 6,865,718 | B2 | 3/2005 | Montalcini |
| 6,225,980 | B1 | 5/2001 | Weiss et al. | 6,886,842 | B2 | 5/2005 | Vey et al. |
| 6,226,534 | B1 | 5/2001 | Aizawa | 6,894,916 | B2 | 5/2005 | Reohr et al. |
| 6,227,966 | B1 | 5/2001 | Yokoi | D506,476 | S | 6/2005 | Andre et al. |
| D443,616 | S | 6/2001 | Fisher et al. | 6,922,189 | B2 | 7/2005 | Fujiyoshi |
| 6,243,078 | B1 | 6/2001 | Rosenberg | 6,930,494 | B2 | 8/2005 | Tesdahl et al. |
| 6,243,080 | B1 | 6/2001 | Molne | 6,958,614 | B2 | 10/2005 | Morimoto |
| 6,243,646 | B1 | 6/2001 | Ozaki et al. | 6,977,808 | B2 | 12/2005 | Lam et al. |
| 6,248,017 | B1 | 6/2001 | Roach | 6,978,127 | B1 | 12/2005 | Bulthuis et al. |
| 6,254,477 | B1 | 7/2001 | Sasaki et al. | 6,985,137 | B2 | 1/2006 | Kaikuranta |
| 6,256,011 | B1 | 7/2001 | Culver | 7,006,077 | B1 | 2/2006 | Uusimäki |
| 6,259,491 | B1 | 7/2001 | Ekedahl et al. | 7,019,225 | B2 | 3/2006 | Matsumoto et al. |
| 6,262,717 | B1 | 7/2001 | Donohue et al. | 7,046,230 | B2 | 5/2006 | Zadesky et al. |
| 6,262,785 | B1 | 7/2001 | Kim | 7,069,044 | B2 | 6/2006 | Okada et al. |
| 6,266,050 | B1 | 7/2001 | Oh et al. | 7,078,633 | B2 * | 7/2006 | Ihalainen .................. 200/6 A |
| 6,285,211 | B1 | 9/2001 | Sample et al. | 7,084,856 | B2 | 8/2006 | Huppi |
| D448,810 | S | 10/2001 | Goto | 7,113,196 | B2 | 9/2006 | Kerr |
| 6,297,795 | B1 | 10/2001 | Kato et al. | 7,117,136 | B1 | 10/2006 | Rosedale |
| 6,297,811 | B1 | 10/2001 | Kent et al. | 7,119,792 | B1 | 10/2006 | Andre et al. |
| 6,300,946 | B1 | 10/2001 | Lincke et al. | 7,215,319 | B2 | 5/2007 | Kamijo et al. |
| 6,307,539 | B2 | 10/2001 | Suzuki | 7,233,318 | B1 | 6/2007 | Farag et al. |
| D450,713 | S | 11/2001 | Masamitsu et al. | 7,236,154 | B1 | 6/2007 | Kerr et al. |
| 6,314,483 | B1 | 11/2001 | Goto et al. | 7,236,159 | B1 | 6/2007 | Siversson |
| 6,321,441 | B1 | 11/2001 | Davidson et al. | 7,253,643 | B1 | 8/2007 | Seguine |
| 6,323,845 | B1 | 11/2001 | Robbins | 7,279,647 | B2 * | 10/2007 | Philipp ........................ 200/5 R |
| D452,250 | S | 12/2001 | Chan | 7,288,732 | B2 * | 10/2007 | Hashida ........................ 200/5 A |
| 6,337,678 | B1 | 1/2002 | Fish | 7,297,883 | B2 * | 11/2007 | Rochon et al. ................ 200/5 R |
| 6,340,800 | B1 | 1/2002 | Zhai et al. | 7,310,089 | B2 | 12/2007 | Baker et al. |
| D454,568 | S | 3/2002 | Andre et al. | 7,312,785 | B2 | 12/2007 | Tsuk et al. |
| 6,357,887 | B1 | 3/2002 | Novak | 7,333,092 | B2 | 2/2008 | Zadesky et al. |
| D455,793 | S | 4/2002 | Lin | 7,348,898 | B2 * | 3/2008 | Ono ................................ 341/33 |
| 6,373,265 | B1 | 4/2002 | Morimoto et al. | 7,382,139 | B2 | 6/2008 | Mackey |
| 6,373,470 | B1 | 4/2002 | Andre et al. | 7,394,038 | B2 | 7/2008 | Chang |
| 6,377,530 | B1 | 4/2002 | Burrows | 7,395,081 | B2 | 7/2008 | Bonnelykke et al. |
| 6,396,523 | B1 | 5/2002 | Segal et al. | 7,397,467 | B2 | 7/2008 | Park et al. |
| 6,424,338 | B1 | 7/2002 | Anderson | 7,439,963 | B2 | 10/2008 | Geaghan et al. |
| 6,429,846 | B2 | 8/2002 | Rosenberg et al. | 7,466,307 | B2 | 12/2008 | Trent et al. |
| 6,429,852 | B1 | 8/2002 | Adams et al. | 7,486,323 | B2 | 2/2009 | Lee et al. |
| 6,452,514 | B1 | 9/2002 | Philipp | 7,502,016 | B2 | 3/2009 | Trent, Jr. et al. |
| 6,465,271 | B1 | 10/2002 | Ko et al. | 7,503,193 | B2 | 3/2009 | Schoene et al. |
| 6,473,069 | B1 | 10/2002 | Gerpheide | 7,593,782 | B2 | 9/2009 | Jobs et al. |
| 6,492,602 | B2 | 12/2002 | Asai et al. | 7,645,955 | B2 | 1/2010 | Huang et al. |
| 6,492,979 | B1 | 12/2002 | Kent et al. | 7,671,837 | B2 * | 3/2010 | Forsblad et al. ............... 345/156 |
| 6,496,181 | B1 | 12/2002 | Bomer et al. | 7,772,507 | B2 * | 8/2010 | Orr et al. ...................... 200/5 R |
| 6,497,412 | B1 | 12/2002 | Bramm | 2001/0011991 | A1 | 8/2001 | Wang et al. |
| D468,365 | S | 1/2003 | Bransky et al. | 2001/0033270 | A1 | 10/2001 | Osawa et al. |
| D469,109 | S | 1/2003 | Andre et al. | 2001/0043545 | A1 | 11/2001 | Aratani |
| D472,245 | S | 3/2003 | Andre et al. | 2001/0050673 | A1 | 12/2001 | Davenport |
| 6,546,231 | B1 | 4/2003 | Someya et al. | 2001/0051046 | A1 | 12/2001 | Watanabe et al. |
| 6,587,091 | B2 | 7/2003 | Serpa | 2002/0011993 | A1 | 1/2002 | Lui et al. |
| 6,606,244 | B1 | 8/2003 | Liu et al. | 2002/0027547 | A1 | 3/2002 | Kamijo |
| 6,618,909 | B1 | 9/2003 | Yang | 2002/0030665 | A1 | 3/2002 | Ano |
| 6,636,197 | B1 | 10/2003 | Goldenberg et al. | 2002/0033848 | A1 | 3/2002 | Sciammarella et al. |

| | | | | | | |
|---|---|---|---|---|---|---|
| 2002/0039493 A1 | 4/2002 | Tanaka | | 2006/0232557 A1 | 10/2006 | Fallot-Burghardt |
| 2002/0045960 A1 | 4/2002 | Phillips et al. | | 2006/0236262 A1 | 10/2006 | Bathiche et al. |
| 2002/0071550 A1 | 6/2002 | Pletikosa | | 2006/0250377 A1 | 11/2006 | Zadesky et al. |
| 2002/0089545 A1 | 7/2002 | Montalcini | | 2006/0274042 A1 | 12/2006 | Krah et al. |
| 2002/0103796 A1 | 8/2002 | Hartley | | 2006/0274905 A1 | 12/2006 | Lindahl et al. |
| 2002/0118131 A1 | 8/2002 | Yates et al. | | 2006/0279896 A1 | 12/2006 | Bruwer |
| 2002/0118169 A1 | 8/2002 | Hinckley et al. | | 2006/0284836 A1 | 12/2006 | Philipp |
| 2002/0145594 A1 | 10/2002 | Derocher | | 2007/0013671 A1 | 1/2007 | Zadesky et al. |
| 2002/0154090 A1 | 10/2002 | Lin | | 2007/0018970 A1 | 1/2007 | Tabasso et al. |
| 2002/0158844 A1 | 10/2002 | McLoone et al. | | 2007/0052044 A1 | 3/2007 | Forsblad et al. |
| 2002/0164156 A1 | 11/2002 | Bilbrey | | 2007/0052691 A1 | 3/2007 | Zadesky et al. |
| 2002/0180701 A1 | 12/2002 | Hayama et al. | | 2007/0080936 A1 | 4/2007 | Tsuk et al. |
| 2002/0196239 A1 | 12/2002 | Lee | | 2007/0080938 A1 | 4/2007 | Robbin et al. |
| 2003/0002246 A1 | 1/2003 | Kerr | | 2007/0080952 A1 | 4/2007 | Lynch et al. |
| 2003/0025679 A1 | 2/2003 | Taylor et al. | | 2007/0083822 A1 | 4/2007 | Robbin et al. |
| 2003/0028346 A1 | 2/2003 | Sinclair et al. | | 2007/0085841 A1 | 4/2007 | Tsuk et al. |
| 2003/0043121 A1 | 3/2003 | Chen | | 2007/0097086 A1 | 5/2007 | Battles et al. |
| 2003/0043174 A1 | 3/2003 | Hinckley et al. | | 2007/0120834 A1 | 5/2007 | Boillot |
| 2003/0050092 A1 | 3/2003 | Yun | | 2007/0126696 A1 | 6/2007 | Boillot |
| 2003/0076301 A1 | 4/2003 | Tsuk et al. | | 2007/0152975 A1 | 7/2007 | Ogihara |
| 2003/0076303 A1 | 4/2003 | Huppi | | 2007/0152977 A1 | 7/2007 | Ng et al. |
| 2003/0076306 A1 | 4/2003 | Zadesky et al. | | 2007/0152983 A1 | 7/2007 | McKillop et al. |
| 2003/0091377 A1 | 5/2003 | Hsu et al. | | 2007/0155434 A1 | 7/2007 | Jobs et al. |
| 2003/0095095 A1 | 5/2003 | Pihlaja | | 2007/0157089 A1 | 7/2007 | Van Os et al. |
| 2003/0095096 A1 | 5/2003 | Robbin et al. | | 2007/0242057 A1 | 10/2007 | Zadesky et al. |
| 2003/0098851 A1 | 5/2003 | Brink | | 2007/0247421 A1 | 10/2007 | Orsley et al. |
| 2003/0103043 A1 | 6/2003 | Mulligan et al. | | 2007/0247443 A1 | 10/2007 | Philipp |
| 2003/0135292 A1 | 7/2003 | Husgafvel et al. | | 2007/0273671 A1 | 11/2007 | Zadesky et al. |
| 2003/0142081 A1 | 7/2003 | Iizuka et al. | | 2007/0276525 A1 | 11/2007 | Zadesky et al. |
| 2003/0184517 A1 | 10/2003 | Senzui et al. | | 2007/0279394 A1 | 12/2007 | Lampell |
| 2003/0197740 A1 | 10/2003 | Reponen | | 2007/0290990 A1 | 12/2007 | Robbin et al. |
| 2003/0206202 A1 | 11/2003 | Moriya | | 2007/0291016 A1 | 12/2007 | Philipp |
| 2003/0210537 A1 | 11/2003 | Engelmann | | 2007/0296709 A1 | 12/2007 | GuangHai |
| 2004/0027341 A1 | 2/2004 | Derocher | | 2008/0006453 A1 | 1/2008 | Hotelling et al. |
| 2004/0080682 A1 | 4/2004 | Dalton | | 2008/0006454 A1 | 1/2008 | Hotelling |
| 2004/0109357 A1 | 6/2004 | Cernea et al. | | 2008/0007533 A1 | 1/2008 | Hotelling et al. |
| 2004/0150619 A1 | 8/2004 | Baudisch et al. | | 2008/0007539 A1 | 1/2008 | Hotelling et al. |
| 2004/0156192 A1 | 8/2004 | Kerr et al. | | 2008/0012837 A1 | 1/2008 | Marriott et al. |
| 2004/0178997 A1 | 9/2004 | Gillespie et al. | | 2008/0018615 A1 | 1/2008 | Zadesky et al. |
| 2004/0215986 A1 | 10/2004 | Shakkarwar | | 2008/0018616 A1 | 1/2008 | Lampell et al. |
| 2004/0224638 A1 | 11/2004 | Fadell et al. | | 2008/0018617 A1 | 1/2008 | Ng et al. |
| 2004/0239622 A1 | 12/2004 | Proctor et al. | | 2008/0036473 A1 | 2/2008 | Jansson |
| 2004/0252109 A1 | 12/2004 | Trent, Jr. et al. | | 2008/0036734 A1 | 2/2008 | Forsblad et al. |
| 2004/0252867 A1 | 12/2004 | Lan et al. | | 2008/0060925 A1 | 3/2008 | Weber et al. |
| 2004/0253989 A1 | 12/2004 | Tupler et al. | | 2008/0079699 A1 | 4/2008 | Mackey |
| 2004/0263388 A1 | 12/2004 | Krumm et al. | | 2008/0087476 A1 | 4/2008 | Prest |
| 2004/0267874 A1 | 12/2004 | Westberg et al. | | 2008/0088582 A1 | 4/2008 | Prest |
| 2005/0012644 A1 | 1/2005 | Hurst et al. | | 2008/0088596 A1 | 4/2008 | Prest |
| 2005/0017957 A1 | 1/2005 | Yi | | 2008/0088597 A1 | 4/2008 | Prest |
| 2005/0024341 A1 | 2/2005 | Gillespie et al. | | 2008/0088600 A1 | 4/2008 | Prest |
| 2005/0030048 A1 | 2/2005 | Bolender | | 2008/0094352 A1 | 4/2008 | Tsuk et al. |
| 2005/0052425 A1 | 3/2005 | Zadesky et al. | | 2008/0098330 A1 | 4/2008 | Tsuk et al. |
| 2005/0052426 A1 | 3/2005 | Hagermoser et al. | | 2008/0110739 A1 | 5/2008 | Peng et al. |
| 2005/0052429 A1 | 3/2005 | Philipp | | 2008/0111795 A1 | 5/2008 | Bollinger |
| 2005/0068304 A1 | 3/2005 | Lewis et al. | | 2008/0143681 A1* | 6/2008 | XiaoPing ............... 345/173 |
| 2005/0083299 A1 | 4/2005 | Nagasaka | | 2008/0158145 A1 | 7/2008 | Westerman |
| 2005/0083307 A1 | 4/2005 | Aufderheide | | 2008/0165141 A1 | 7/2008 | Christie |
| 2005/0090288 A1 | 4/2005 | Stohr et al. | | 2008/0165158 A1 | 7/2008 | Hotelling et al. |
| 2005/0104867 A1 | 5/2005 | Westerman et al. | | 2008/0196945 A1 | 8/2008 | Konstas |
| 2005/0110768 A1 | 5/2005 | Marriott et al. | | 2008/0209442 A1 | 8/2008 | Setlur et al. |
| 2005/0140657 A1 | 6/2005 | Park et al. | | 2008/0264767 A1 | 10/2008 | Chen et al. |
| 2005/0143124 A1 | 6/2005 | Kennedy et al. | | 2008/0280651 A1 | 11/2008 | Duarte |
| 2005/0156881 A1 | 7/2005 | Trent et al. | | 2008/0284742 A1 | 11/2008 | Prest |
| 2005/0162402 A1 | 7/2005 | Watanachote | | 2008/0293274 A1 | 11/2008 | Milan |
| 2005/0204309 A1 | 9/2005 | Szeto | | 2009/0021267 A1 | 1/2009 | Golovchenko et al. |
| 2005/0237308 A1 | 10/2005 | Autio et al. | | 2009/0026558 A1 | 1/2009 | Bauer et al. |
| 2006/0026521 A1 | 2/2006 | Hotelling et al. | | 2009/0033635 A1 | 2/2009 | Wai |
| 2006/0026535 A1 | 2/2006 | Hotelling et al. | | 2009/0036176 A1* | 2/2009 | Ure ............... 455/575.3 |
| 2006/0026536 A1 | 2/2006 | Hotelling et al. | | 2009/0058801 A1 | 3/2009 | Bull |
| 2006/0032680 A1 | 2/2006 | Elias et al. | | 2009/0058802 A1 | 3/2009 | Orsley et al. |
| 2006/0038791 A1 | 2/2006 | Mackey | | 2009/0073130 A1 | 3/2009 | Weber et al. |
| 2006/0066582 A1 | 3/2006 | Lyon et al. | | 2009/0078551 A1 | 3/2009 | Kang |
| 2006/0066588 A1 | 3/2006 | Lyon et al. | | 2009/0109181 A1* | 4/2009 | Hui et al. ............... 345/173 |
| 2006/0097991 A1 | 5/2006 | Hotelling et al. | | 2009/0141046 A1 | 6/2009 | Rathnam et al. |
| 2006/0131156 A1 | 6/2006 | Voelckers | | 2009/0160771 A1 | 6/2009 | Hinckley et al. |
| 2006/0143574 A1 | 6/2006 | Ito et al. | | 2009/0179854 A1 | 7/2009 | Weber et al. |
| 2006/0174568 A1 | 8/2006 | Kinoshita et al. | | 2009/0197059 A1 | 8/2009 | Weber et al. |
| 2006/0181517 A1 | 8/2006 | Zadesky et al. | | 2009/0229892 A1 | 9/2009 | Fisher et al. |
| 2006/0197750 A1 | 9/2006 | Kerr et al. | | 2009/0273573 A1 | 11/2009 | Hotelling |

| | | | | | |
|---|---|---|---|---|---|
| 2010/0058251 A1 | 3/2010 | Rottler et al. | JP | 6-084428 | 3/1994 |
| 2010/0060568 A1 | 3/2010 | Fisher et al. | JP | 6-089636 | 3/1994 |
| 2010/0073319 A1 | 3/2010 | Lyon et al. | JP | 6-96639 | 4/1994 |
| 2010/0149127 A1 | 6/2010 | Fisher et al. | JP | 6-111695 | 4/1994 |

FOREIGN PATENT DOCUMENTS

| | | | | | |
|---|---|---|---|---|---|
| CN | 1455615 | 11/2003 | JP | 6-139879 | 5/1994 |
| CN | 1499356 | 5/2004 | JP | 6-187078 | 7/1994 |
| CN | 1659506 | 8/2005 | JP | 6-208433 | 7/1994 |
| DE | 3615742 | 11/1987 | JP | 6-267382 | 9/1994 |
| DE | 19722636 | 12/1998 | JP | 6-283993 | 10/1994 |
| DE | 10022537 | 11/2000 | JP | 6-333459 | 12/1994 |
| DE | 20019074 U1 | 2/2001 | JP | 7-107574 | 4/1995 |
| DE | 10 2004 043 663 | 4/2006 | JP | 7-41882 | 7/1995 |
| EP | 0178157 | 4/1986 | JP | 7-201249 | 8/1995 |
| EP | 0419145 A1 | 3/1991 | JP | 7-201256 | 8/1995 |
| EP | 0 498 540 | 8/1992 | JP | 7-253838 | 10/1995 |
| EP | 0 521 683 | 1/1993 | JP | 7-261899 | 10/1995 |
| EP | 0 674 288 | 9/1995 | JP | 7-261922 | 10/1995 |
| EP | 0 731 407 | 9/1996 | JP | 7-296670 | 11/1995 |
| EP | 0 551 778 B1 | 1/1997 | JP | 7-319001 | 12/1995 |
| EP | 0 880 091 A2 | 11/1998 | JP | 8-016292 | 1/1996 |
| EP | 1 026 713 | 8/2000 | JP | 8-115158 | 5/1996 |
| EP | 1 081 922 A2 | 3/2001 | JP | 8-203387 | 8/1996 |
| EP | 1 098 241 A2 | 5/2001 | JP | 8-293226 | 11/1996 |
| EP | 1 133 057 | 9/2001 | JP | 8-298045 | 11/1996 |
| EP | 1 162 826 A2 | 12/2001 | JP | 8-299541 | 11/1996 |
| EP | 1 168 396 | 1/2002 | JP | 8-316664 | 11/1996 |
| EP | 1 205 836 A2 | 5/2002 | JP | 9-044289 | 2/1997 |
| EP | 1 244 053 | 9/2002 | JP | 9-069023 | 3/1997 |
| EP | 1 251 455 A2 | 10/2002 | JP | 9-128148 | 5/1997 |
| EP | 1263193 | 12/2002 | JP | 9-134248 | 5/1997 |
| EP | 1347481 | 9/2003 | JP | 9-218747 | 8/1997 |
| EP | 1376326 | 1/2004 | JP | 9-230993 | 9/1997 |
| EP | 1 467 392 | 10/2004 | JP | 9-231858 | 9/1997 |
| EP | 1 482 401 | 12/2004 | JP | 9-233161 | 9/1997 |
| EP | 1 496 467 | 1/2005 | JP | 9-251347 | 9/1997 |
| EP | 1 517 228 | 3/2005 | JP | 9-258895 | 10/1997 |
| EP | 1 542 437 A2 | 6/2005 | JP | 9-288926 | 11/1997 |
| EP | 1 589 407 | 10/2005 | JP | 9-512979 | 12/1997 |
| EP | 1 784 058 A2 | 5/2007 | JP | 10-63467 | 3/1998 |
| EP | 1 841 188 | 10/2007 | JP | 10-74127 | 3/1998 |
| EP | 1850218 | 10/2007 | JP | 10-074429 | 3/1998 |
| EP | 1 876 711 | 1/2008 | JP | 10-198507 | 7/1998 |
| FR | 2 686 440 | 7/1993 | JP | 10-227878 | 8/1998 |
| GB | 2015167 | 9/1979 | JP | 10-240693 | 9/1998 |
| GB | 2072389 | 9/1981 | JP | 10-320322 | 12/1998 |
| GB | 2315186 | 1/1998 | JP | 10-326149 | 12/1998 |
| GB | 2333215 | 7/1999 | JP | 11-24834 | 1/1999 |
| GB | 2391060 | 1/2004 | JP | 11-184607 | 7/1999 |
| GB | 2 402 105 | 12/2004 | JP | 11-194863 | 7/1999 |
| JP | 57-95722 | 6/1982 | JP | 11-194872 | 7/1999 |
| JP | 57-97626 | 6/1982 | JP | 11-194882 | 7/1999 |
| JP | 61-117619 | 6/1986 | JP | 11-194883 | 7/1999 |
| JP | 61-124009 | 6/1986 | JP | 11-194891 | 7/1999 |
| JP | 63-20411 | 1/1988 | JP | 11-195353 | 7/1999 |
| JP | 63-106826 | 5/1988 | JP | 11-203045 | 7/1999 |
| JP | 63-181022 | 7/1988 | JP | 11-212725 | 8/1999 |
| JP | 63-298518 | 12/1988 | JP | 11-272378 | 10/1999 |
| JP | 03-57617 | 6/1991 | JP | 11-338628 | 12/1999 |
| JP | 3-192418 | 8/1991 | JP | 2000-215549 | 8/2000 |
| JP | 04-32920 | 2/1992 | JP | 2000-267786 | 9/2000 |
| JP | 4-205408 | 7/1992 | JP | 2000-267797 | 9/2000 |
| JP | 5-041135 | 2/1993 | JP | 2000-353045 | 12/2000 |
| JP | 5-080938 | 4/1993 | JP | 2001-11769 | 1/2001 |
| JP | 5-101741 | 4/1993 | JP | 2001-22508 | 1/2001 |
| JP | 5-36623 | 5/1993 | JP | 2001-184158 | 7/2001 |
| JP | 5-189110 | 7/1993 | JP | 3085481 | 2/2002 |
| JP | 5-205565 | 8/1993 | JP | 2002-215311 | 8/2002 |
| JP | 5-211021 | 8/1993 | JP | 2003-150303 | 5/2003 |
| JP | 5-217464 | 8/1993 | JP | 2003-517674 | 5/2003 |
| JP | 5-233141 | 9/1993 | JP | 2003-280799 | 10/2003 |
| JP | 5-262276 | 10/1993 | JP | 2003-280807 | 10/2003 |
| JP | 5-265656 | 10/1993 | JP | 2004-362097 | 12/2004 |
| JP | 5-274956 | 10/1993 | JP | 2005-251218 | 9/2005 |
| JP | 5-289811 | 11/1993 | JP | 2005-285140 | 10/2005 |
| JP | 5-298955 | 11/1993 | JP | 2005-293606 | 10/2005 |
| JP | 5-325723 | 12/1993 | JP | 2006-004453 | 1/2006 |
| JP | 6-20570 | 1/1994 | JP | 2006-178962 | 7/2006 |
| | | | JP | 3852854 | 12/2006 |
| | | | JP | 2007-123473 | 5/2007 |

| | | |
|---|---|---|
| KR | 1998-71394 | 10/1998 |
| KR | 1999-50198 | 7/1999 |
| KR | 2000-0008579 | 2/2000 |
| KR | 2001-0052016 | 6/2001 |
| KR | 2001-108361 | 12/2001 |
| KR | 2002-65059 | 8/2002 |
| KR | 10-2006-0021678 | 3/2006 |
| TW | 431607 | 4/2001 |
| TW | 00470193 | 12/2001 |
| TW | 547716 | 8/2003 |
| TW | I220491 | 8/2004 |
| WO | WO-94/17494 | 8/1994 |
| WO | WO-95/00897 A1 | 1/1995 |
| WO | WO-96/27968 | 9/1996 |
| WO | WO 98/14863 | 4/1998 |
| WO | WO-99/49443 | 9/1999 |
| WO | WO-00/79772 | 12/2000 |
| WO | WO-01/02949 | 1/2001 |
| WO | WO-01/44912 | 6/2001 |
| WO | WO-02/08881 | 1/2002 |
| WO | WO-03/044645 | 5/2003 |
| WO | WO 03/044956 | 5/2003 |
| WO | WO-03/025960 | 9/2003 |
| WO | WO 03/088176 | 10/2003 |
| WO | WO 03/090008 | 10/2003 |
| WO | WO-2004/001573 | 12/2003 |
| WO | WO 2004/040606 | 5/2004 |
| WO | WO-2004/091956 | 10/2004 |
| WO | WO-2005/055620 | 6/2005 |
| WO | WO 2005/076117 | 8/2005 |
| WO | WO-2005/114369 | 12/2005 |
| WO | WO 2005/124526 | 12/2005 |
| WO | WO-2006/020305 | 2/2006 |
| WO | WO-2006/021211 A2 | 3/2006 |
| WO | WO 2006/037545 | 4/2006 |
| WO | WO 2006/104745 | 10/2006 |
| WO | WO-2006/135127 | 12/2006 |
| WO | WO 2007/025858 | 3/2007 |
| WO | WO-2007/078477 | 7/2007 |
| WO | WO-2007/084467 | 7/2007 |
| WO | WO-2007/089766 | 8/2007 |
| WO | WO-2008/045414 | 4/2008 |
| WO | WO-2008/045833 | 4/2008 |

OTHER PUBLICATIONS

Interlink Electronics, VersaPad: Integration Guide, ©1998 (VersaPad), pp. 1-35.
Ng et al., U.S. Office Action mailed Jan. 14, 2010, directed to U.S. Appl. No. 11/394,493; 20 pages.
Ng et al., U.S. Office Action mailed Jan. 15, 2010, directed to U.S. Appl. No. 11/882,423; 22 pages.
Tsuk et al., U.S. Office Action mailed Dec. 31, 2009, directed to U.S. Appl. No. 11/610,190; 25 pages.
Zadesky et al., U.S. Office Action mailed Feb. 4, 2010, directed to U.S. Appl. No. 11/477,469; 14 pages.
Hotelling, U.S. Office Action mailed Jan. 25, 2010, directed to U.S. Appl. No. 11/482,286; 17 pages.
Lynch et al., U.S. Office Action mailed Oct. 5, 2009, directed to U.S. Appl. No. 11/499,360; 7 pages.
Lynch et al., U.S. Office Action mailed Jan. 27, 2010, directed to U.S. Appl. No. 11/499,360; 8 pages.
Letter re: Bang & Olufsen a/s by David Safran, Nixon Peabody, LLP, May 21, 2004, with BeoCom 6000 Sales Training Brochure, 7 pages.
Kobayashi et al. (1994) "Development of the Touch Switches with the Click Response," Koukuu Denshi Gihou No. 17, pp. 44-48 (published by the Japan Aviation Electronics Industry, Ltd.).
Photographs of Innovation 2000 Best of Show Award Presented at the 2000 Int'l CES Innovations Design & Engineering Showcase, Jan. 6, 2000, 1 page.
SanDisk Sansa Connect User Guide, 2007; 29 pages.
Robbin, U.S. Appl. No. 60/346,237 entitled, "Method and System for List Scrolling," filed Oct. 22, 2001; 12 pages.
Zadesky et al., U.S. Appl. No. 60/359,551 entitled "Touchpad for Handheld Device," filed Feb. 25, 2002; 34 pages.
Grignon et al., U.S. Appl. No. 60/755,656, filed Dec. 30, 2005, entitled "Touch Pad with Feedback"; 109 pages.
Elias et al., U.S. Appl. No. 60/522,107, filed Aug. 16, 2004, entitled, "A Method for Increasing the Spatial Resolution of Touch Sensitive Devices"; 15 pages.
Hotelling, U.S. Appl. No. 60/658,777 titled "Multi-Functional Handheld Device," filed Mar. 4, 2005; 68 pages.
Zadesky et al., U.S. Appl. No. 60/714,609 entitled "Scrolling Input Arrangements Using Capacitive Sensors on a Flexible Membrane," filed Sep. 6, 2005; 17 pages.
Lampell et al., U.S. Appl. No. 60/810,423, filed Jun. 2, 2006, entitled "Techniques for Interactive Input to Portable Electronic Devices"; 53 pages.
Prest et al., U.S. Appl. No. 60/850,662, filed Oct. 11, 2006, entitled, "Capacitive Scroll Wheel"; 21 pages.
Bollinger, U.S. Appl. No. 60/858,404, filed Nov. 13, 2006, entitled "Method of Capacitively Sensing Finger Position"; 13 pages.
Rothkopf, U.S. Appl. No. 60/935,854 titled "Compact Media Players," filed Sep. 4, 2007; 36 pages.
Rathnam et al., U.S. Appl. No. 60/992,056, filed Dec. 3, 2007, entitled, "Scroll Wheel Circuit Arrangements and Methods of Use Thereof"; 42 pages.
Rathnam et al., U.S. Appl. No. 61/017,436, filed Dec. 28, 2007, entitled, "Multi-Touch Scroll Wheel Circuit Arrangements and Processing Methods"; 58 pages.
Weber et al., U.S. Appl. No. 61/020,531, filed Jan. 11, 2008 entitled "Modifiable Clickwheel Text"; 11 pages.
Weber et al., U.S. Appl. No. 61/025,531, filed Feb. 1, 2008 entitled "Co-Extruded Materials and Methods"; 11 pages.
Fisher et al., U.S. Appl. No. 61/036,804, filed Mar. 14, 2008 entitled "Switchable Sensor Configurations"; 46 pages.
Beaver et al., U.S. Appl. No. 12/042,318, filed Mar. 4, 2008 entitled, "Touch Event Model"; 36 pages.
Tsuk et al., U.S. Office Action mailed Apr. 28, 2010, directed to U.S. Appl. No. 11/610,190; 29 pages.
Zadesky et al., U.S. Office Action mailed Mar. 30, 2010, directed to U.S. Appl. No. 11/592,679; 13 pages.
Hotelling et al., U.S. Office Action mailed Mar. 30, 2010, directed to U.S. Appl. No. 11/483,008; 20 pages.
Elias et al., U.S. Office Action mailed Mar. 30, 2010, directed to U.S. Appl. No. 11/203,692; 15 pages.
Ng et al., U.S. Office Action mailed Jun. 22, 2010, directed to U.S. Appl. No. 11/394,493; 14 pages.
Lampell, U.S. Office Action mailed Jun. 4, 2010, directed to U.S. Appl. No. 11/530,807; 15 pages.
Prest et al., U.S. Office Action mailed Jun. 22, 2010, directed to U.S. Appl. No. 11/878,132; 32 pages.
Prest et al., U.S. Office Action mailed Jun. 22, 2010, directed to U.S. Appl. No. 11/882,882; 32 pages.
Prest et al., U.S. Office Action mailed Jun. 23, 2010, directed to U.S. Appl. No. 11/812,384; 29 pages.
Prest et al., U.S. Office Action mailed Jun. 22, 2010, directed to U.S. Appl. No. 11/882,890; 15 pages.
Prest et al., U.S. Office Action mailed Jun. 22, 2010, directed to U.S. Appl. No. 11/812,383; 21 pages.
Prest et al., U.S. Office Action mailed Jun. 23, 2010, directed to U.S. Appl. No. 11/882,889; 13 pages.
Bollinger et al., U.S. Office Action mailed Jun. 25, 2010, directed to U.S. Appl. No. 11/842,724; 22 pages.
Hotelling, U.S. Office mailed Jun. 9, 2010, directed to U.S. Appl. No. 11/482,286; 21 pages.
Elias et al., U.S. Office Action mailed Jun. 11, 2010, directed to U.S. Appl. No. 11/203,692; 17 pages.
Weber et al., U.S. Office Action mailed Jun. 7, 2010, directed to U.S. Appl. No. 11/856,530; 15 pages.
Ng et al., U.S. Office Action mailed Jul. 8, 2010, directed to U.S. Appl. No. 11/882,423; 19 pages.
ISR and Written Opinion issued Jul. 31, 2009, directed to corresponding Application No. PCT/US2008/075212; 15 pages.
Robbin et al., U.S. Appl. No. 60/387,692 entitled "Method and Apparatus for Use of Rotational User Inputs," filed Jun. 10, 2002.
Robbin et al., U.S. Appl. No. 60/399,806 entitled "Graphical User Interface and Methods of Use Thereof in a Multimedia Player," filed Jul. 30, 2002.

Tsuk et al., U.S. Office Action mailed Oct. 13, 2006, directed to U.S. Appl. No. 10/256,716; 16 pages.
Tsuk et al., U.S. Office Action mailed Aug. 3, 2006, directed to U.S. Appl. No. 10/256,716; 15 pages.
Tsuk et al., U.S. Office Action mailed Jan. 10, 2006, directed to U.S. Appl. No. 10/256,716; 12 pages.
Tsuk et al., U.S. Office Action mailed Jun. 24, 2005, directed to U.S. Appl. No. 10/256,716; 12 pages.
Tsuk et al., U.S. Office Action mailed Sep. 30, 2004, directed to U.S. Application No. 10/256,716; 11 pages.
Tsuk et al., U.S. Office Action mailed Jul. 7, 2009, directed to U.S. Appl. No. 11/610,190; 24 pages.
Robbin et al., U.S. Office Action mailed Jan. 18, 2007, directed to U.S. Appl. No. 10/259,159; 18 pages.
Robbin et al., U.S. Office Action mailed Oct. 13, 2006, directed to U.S. Appl. No. 10/259,159; 18 pages.
Robbin et al., U.S. Office Action mailed Aug. 3, 2006, directed to U.S. Appl. No. 10/259,159; 15 pages.
Robbin et al., U.S. Office Action mailed Jan. 11, 2006, directed to U.S. Appl. No. 10/259,159; 15 pages.
Robbin et al., U.S. Office Action mailed Jun. 16, 2005, directed to U.S. Appl. No. 10/259,159; 16 pages.
Robbin et al., U.S. Office Action mailed Sep. 30, 2004, directed to U.S. Appl. No. 10/259,159; 14 pages.
Zadesky et al., U.S. Office Action mailed Jul. 9, 2008, directed to U.S. Appl. No. 10/643,256; 12 pages.
Zadesky et al., U.S. Office Action mailed Dec. 12, 2007, directed to U.S. Appl. No. 10/643,256; 12 pages.
Zadesky et al., U.S. Office Action mailed Jul. 13, 2007, directed to U.S. Appl. No. 10/643,256; 13 pages.
Zadesky et al., U.S. Office Action mailed Mar. 23, 2007, directed to U.S. Appl. No. 10/643,256; 11 pages.
Zadesky et al., U.S. Office Action mailed Oct. 27, 2006, directed to U.S. Appl. No. 10/643,256; 14 pages.
Forsblad et al., U.S. Office Action mailed Jun. 25, 2009, directed to U.S. Appl. No. 11/355,022; 18 pages.
Forsblad et al., U.S. Office Action mailed Jan. 26, 2009, directed to U.S. Appl. No. 11/355,022; 15 pages.
Hotelling et al., U.S. Office Action mailed Jan. 27, 2009, directed to U.S. Appl. No. 11/882,421; 15 pages.
Zadesky et al., U.S. Office Action mailed Aug. 6, 2009, directed to U.S. Appl. No. 11/057,050; 30 pages.
Zadesky et al., U.S. Office Action mailed Feb. 20, 2009, directed to U.S. Appl. No. 11/057,050; 25 pages.
Zadesky et al., U.S. Office Action mailed Dec. 24, 2008, directed to U.S. Appl. No. 11/057,050; 25 pages.
Zadesky et al., U.S. Office Action mailed Nov. 26, 2008, directed to U.S. Appl. No. 11/057,050; 25 pages.
Zadesky et al, U.S. Office Action mailed Aug. 19, 2008, directed to U.S. Appl. No. 11/057,050; 23 pages.
Zadesky et al., U.S. Office Action mailed Nov. 20, 2007, directed to U.S. Appl. No. 11/057,050; 33 pages.
Zadesky et al., U.S. Office Action mailed Mar. 5, 2009, directed to U.S. Appl. No. 11/477,469; 12 pages.
Zadesky et al., U.S. Office Action mailed Jul. 30, 2004, directed to U.S. Appl. No. 10/188,182; 7 pages.
Zadesky et al., U.S. Office Action mailed Sep. 21, 2005, directed to U.S. Appl. No. 10/188,182; 10 pages.
Zadesky et al., U.S. Office Action mailed Mar. 4, 2004, directed to U.S. Appl. No. 10/188,182; 8 pages.
Zadesky et al., U.S. Office Action mailed Oct. 4, 2007, directed to U.S. Appl. No. 11/386,238; 12 pages.
Zadesky et al.., U.S. Office Action mailed Oct. 4, 2007, directed to U.S. Appl. No. 11/806,957; 14 pages.
Marriott et al., U.S. Office Action mailed Jan. 30, 2008, directed to U.S. Appl. No. 10/722,948; 17 pages.
Marriott et al., U.S. Office Action mailed Jul. 13, 2007, directed to U.S. Appl. No. 10/722,948; 15 pages.
Marriott et al., U.S. Office Action mailed Dec. 12, 2006, directed to U.S. Appl. No. 10/722,948; 14 pages.
Marriott et al., U.S. Office Action mailed Jun. 2, 2006, directed to U.S. Appl. No. 10/722,948; 12 pages.
Hotelling et al., U.S. Office Action mailed Jul. 24, 2009, directed to U.S. Appl. No. 11/483,008; 17 pages.
Hotelling et al., U.S. Office Action mailed Jul. 27, 2009, directed to U.S. Appl. No. 11/882,420; 17 pages.
Elias et al., U.S. Office Action mailed Aug. 4, 2009, directed to U.S. Appl. No. 11/203,692; 12 pages.
Elias et al., U.S. Office Action mailed Feb. 23, 2009, directed to U.S. Appl. No. 11/203,692; 13 pages.
Elias et al., U.S. Office Action mailed Sep. 17, 2008, directed to U.S. Appl. No. 11/203,692; 8 pages.
Tsuk et al., U.S. Office Action mailed Aug. 6, 2010, directed to U.S. Appl. No. 11/610,190; 30 pages.
Zadesky et al., U.S. Office Action mailed Aug. 2, 2010, directed to U.S. Appl. No. 11/882,004; 9 pages.
Marriott et al., U.S. Office Action mailed Aug. 19, 2010, directed to U.S. Appl. No. 11/882,422; 13 pages.
Hotelling, U.S. Office Action mailed Aug. 18, 2010, directed to U.S. Appl. No. 11/882,424; 16 pages.
Bull, U.S. Office Action mailed Jul. 9, 2010, directed to U.S. Appl. No. 11/849,801; 13 pages.
Tsuk et al., U.S. Office Action mailed Aug. 7, 2009, directed to U.S. Appl. No. 11/610,181; 20 pages.
Robbin et al., U.S. Office Action mailed Aug. 10, 2009, directed to U.S. Appl. No. 11/610,376; 11 pages.
Robbin et al., U.S. Office Action mailed Aug. 12, 2009, directed to U.S. Appl. No. 11/610,384; 20 pages.
Hotelling, U.S. Office Action mailed Sep. 1, 2009, directed to U.S. Appl. No. 11/482,286; 14 pages.
Lampell, U.S. Office Action mailed Sep. 15, 2009, directed to U.S. Appl. No. 11/530,807; 15 pages.
Boling, Douglas (1993) "Programming Microsoft Windows CE.NET," p. 109.
"About Quicktip®" www.logicad3d.com/docs/qt.html., downloaded Apr. 8, 2002.
"Alps Electric Ships GlidePoint Keyboard for the Macintosh; Includes a GlidePoint Touchpad, Erase-Eaze Backspace Key and Contoured Wrist Rest," Business Wire (Jul. 1, 1996).
"Alps Electric introduces the GlidePoint Wave Keyboard; combines a gently curved design with Alps' advanced GlidePoint Technology," Business Wire (Oct. 21, 1996).
"Apple Presents iPod: Ultra-Portable MP3 Music Player Puts 1,000 Songs in Your Pocket," retreived from http://www.apple.com/pr/library/2001/oct/23ipod.html on Oct. 23, 2001.
"Apple Unveils Optical Mouse and New Pro Keyboard," Press Release, Jul. 19, 2000.
"APS show guide to exhibitors," Physics Today 49(3) (Mar. 1996).
"Atari VCS/2600 Peripherals," www.classicgaming.com/gamingmuseum/2006p.html, downloaded Feb. 28, 2007, pp. 1-15.
"Der Klangmeister," Connect Magazine, Aug. 1998.
"Design News literature plus," Design News 51(24) (Dec. 18, 1995).
"Neuros MP3 Digital Audio Computer," www.neurosaudio.com, downloaded Apr. 9, 2003.
"OEM Touchpad Modules" website www.glidepoint.com/sales/modules.index.shtml, downloaded Feb. 13, 2002.
"Product Overview—ErgoCommander®," www.logicad3d.com/products/ErgoCommander.htm, downloaded Apr. 8, 2002.
"Product Overview—SpaceMouse® Classic," www.logicad3d.com/products/Classic.htm, downloaded Apr. 8, 2002.
"System Service and Troubleshooting Manual," www.dsplib.com/intv/Master, downloaded Dec. 11, 2002.
"Synaptics Tough Pad Interfacing Guide," Second Edition, Mar. 25, 1998, Synaptics, Inc., San Jose, CA, pp. 1-90.
"Triax Custom Controllers due; Video Game Controllers," HFD-The Weekly Home Furnishing Newspaper 67(1) (Jan. 4, 1993).
Ahl, David, "Controller Update," Creative Computing Vo. 9, No. 12, Dec. 1983.
Ahmad, "A Usable Real-Time 3D Hand Tracker," Proceedings of the 28th Asilomar Conference on Signals, Systems and Computers—Part 2 (of 2) vol. 2 (Oct. 1994).
Baig, E.C., "Your PC Just Might Need a Mouse," U.S. News & World Report 108(22) (Jun. 4, 1990).
Bang & Olufsen Telecom a/s, "BeoCom 6000 User Guide 2000," Jan. 2000.

Bartimo, Jim, "The Portables: Travelling Quickly," Computerworld (Nov. 14, 1983).
Bray, "Phosphors help switch on xenon," Physics in Action, pp. 1-3, Apr. 1999.
Brink et al., "Pumped-up portables," U.S. News & World Report 116(21) (May 30, 1994).
Brown et al., "Windows on Tablets as a Means of Achieving Virtual Input Devices," Human-Computer Interaction—Interact '90 (1990), Aug. 1990.
Buxton et al., "Issues and Techniques in Touch-Sensitive Tablet Input," Computer Graphics 19(3), Proceedings of SIGGRAPH '85 (1985), Jul. 1985.
Chapweske, Adam "PS/2 Mouse/Keyboard Protocol," 1999, http://panda.cs.ndsu.nodak.edu/~achapwes/PICmicro/PS2/ps2.htm, Jan. 1999.
Chen et al., "A Study in Interactive 3-D Rotation Using 2-D Control Devices," Computer Graphics 22(4) (Aug. 1988).
Chinese Office Action issue Dec. 29, 2006, directed to CN Application No. 200510103886.3, 25 pages.
De Meyer, Kevin, "Crystal Optical Mouse," Feb. 14, 2002, Heatseekerz, Web Article 19.
Evans et al., "Tablet-based Valuators that Provide One, Two, or Three Degrees of Freedom," Computer Graphics 15(3) (Aug. 1981).
EVB Elektronik "TSOP6238 IR Receiver Modules for Infrared Remote Control Systems" dated Jan. 2004 1 page.
Fiore, "Zen Touchpad," Cornell University, May 2000.
Gadgetboy, "Point and click with the latest mice," CNET Asia Product Review, www.asia.cnet.com/reviews...are/gadgetboy/0,39001770,380235900,00.htm, downloaded Dec. 5, 2001.
Gfroerer, "Photoluminescence in Analysis of Surfaces and Interfaces," Encyclopedia of Analytical Chemistry, pp. 1-23, Copyright John Wiley & Sons Ltd, Chichester, 2000, Jan. 2000.
Jesitus, John, "Broken promies?", Industry Week/IW 246(20) (Nov. 3, 1997).
Kobayashi (1996) "Design of Dynamic Soundscape: Mapping Time to Space for Audio Browsing with Simultaneous Listening," Thesis submitted to Program in Media Arts and Sciences at the Massachusetts Institute of Technology, (58 pages), Sep. 1996.
Kobayashi et al. (1997) "Dynamic Soundscape: Mapping Time to Space for Audio Browsing," Computer Human Interaction: 16 pages, Mar. 1997.
Kobayashi et al. "Development of the Touch Switches with the Click Response," Koukuu Denshi Gihou No. 17, pp. 44-48 (Mar. 1994) (published by the Japan Aviation Electronics Industry, Ltd.).
Letter re: Bang & Olufsen a/s by David Safran, Nixon Peabody, LLP May 21, 2004.
Luna Technologies International, Inc., LUNA Photoluminescent Safety Products, "Photoluminescence-What is Photoluminescence?" from website at http://www.lunaplast.com/photoluminescence.com on Dec. 27, 2005.
"Manufactures," Laser Focus World, Buyers Guide '96, 31(12) (Dec. 1995).
Mims, Forrest M., III, "A Few Quick Pointers; Mouses, Touch Screens, Touch Pads, Light Pads, and The Like Can Make System Easier to Use," Computers & Electronics (22) (May 1984).
Nass, Richard, "Touchpad input device goes digital to give portable systems a desktop 'mouse-like' feel," Electronic Design 44(18) (Sep. 3, 1996).
"National Design Engineering Show," Design News 52(5) (Mar. 4, 1996).
Perenson, Melissa, "New & Improved: Touchpad Redux," PC Magazine (Sep. 10, 1996).
Petersen, Marty, "Koala Pad Touch Tablet & Micro Illustrator Software," InfoWorld. (Oct. 10, 1983).
Petruzzellis, "Force-Sensing Resistors," Electronics Now 64(3) (Mar. 1993).
Photographs of Innovation 2000 Best of Show Award Presented a the 2000 Int'l CES Innovations 2000 Design & Engineering Showcase, 1 page, Jan. 2000.
"Preview of exhibitor booths at the Philadelphia show," Air Conditioning, Heating & News 200(2) (Jan. 13, 1997).
"Product news," Design News 53(9) (May 5, 1997).
"Product news," Design News 53(11) (Jun. 9, 1997).
Sony presents "Choice Without Compromise" at IBC '97 M2 Presswire (Jul. 24, 1997).
Spiwak, Marc, "A Great New Wireless Keyboard," Popular Electronics 14(12) (Dec. 1997).
Spiwak, Marc, "A Pair of Unusual Controllers," Popular Electronics 14(4) (Apr. 1997).
Soderholm, Lars G., "Sensing Systems for 'Touch and Feel," Design News (May 8, 1989): pp. 72-76.
Sylvania, "Intellvision™ Intelligent Television Master Component Service Manual," pp. 1, 2 and 8, 1979, Jan. 1979.
Tessler, Franklin, "Point Pad," Macworld 12(10) (Oct. 1995).
Tessler, Franklin, "Touchpads," Macworld 13(2) (Feb. 1996).
Tessler, Franklin, "Smart Input: How to Chose from the New Generation of Innovative Input Devices," Macworld 13(5) (May 1996).
"Touchpad," Notebook PC Manual, ACER Information Co. Ltd., Feb. 16, 2005, pp. 11-12.
Translation of Trekstor's Defense Statement to the District Court Mannheim of May 23, 2008; 37 pages.
"Diamond Multimedia Announces Rio PMP300 Portable MP3 Music Player," located at http://news.harmony-central.com/Newp/1998/Rio-PMP300.html visited on May 5, 2008. (4 pages).
Tsuk et al., U.S. Office Action mailed Nov. 1, 2010, directed to U.S. Appl. No. 11/959,918; 8 pages.
Tsuk et al., U.S. Office Action mailed Oct. 26, 2010, directed to U.S. Appl. No. 11/959,942; 27 pages.
Robbin et al., U.S. Office Action mailed Oct. 29, 2010, directed to U.S. Appl. No. 11/838,845; 8 pages.
Ng et al., U.S. Office Action mailed Oct. 26, 2010, directed to U.S. Appl. No. 11/882,423; 18 pages.
Zadesky et al., U.S. Office Action mailed Oct. 4, 2010, directed to U.S. Appl. No. 11/057,050; 31 pages.
McKillop et al., U.S. Office Action mailed Sep. 16, 2010, directed to U.S. Appl. No. 11/592,752; 14 pages.
Zadesky et al., U.S. Office Action mailed Sep. 29, 2010, directed to U.S. Appl. No. 11/882,003; 13 pages.
Hotelling, U.S. Office Action mailed Oct. 1, 2010, directed to U.S. Appl. No. 11/482,286; 28 pages.
Hotelling et al., U.S. Office Action mailed Oct. 27, 2010, directed to U.S. Appl. No. 11/483,008; 23 pages.
Weber et al., U.S. Office Action mailed Oct. 13, 2010, directed to U.S. Appl. No. 12/205,795; 15 pages.
Ng et al., U.S. Office Action mailed Dec. 9, 2010, directed to U.S. Appl. No. 11/394,493; 13 pages.
Zadesky et al., U.S. Office Action mailed Nov. 16, 2010, directed to U.S. Appl. No. 11/477,469; 13 pages.
Lampell, U.S. Office Action mailed Dec. 3, 2010, directed to U.S. Appl. No. 11/530,807; 17 pages.
Lampell et al., U.S. Office Action mailed Dec. 22, 2010, directed to U.S. Appl. No. 11/882,427; 16 pages.
Hotelling, U.S. Office Action mailed Dec. 8, 2010, directed to U.S. Appl. No. 11/482,286; 33 pages.
Elias et al., U.S. Office Action mailed Nov. 22, 2010, directed to U.S. Appl. No. 11/203,692; 6 pages.

* cited by examiner

US 7,910,843 B2

COMPACT INPUT DEVICE

CROSS-REFERENCE TO RELATED APPLICATION

This application claims the benefit of U.S. Provisional Application Ser. No. 60/935,854, filed Sep. 4, 2007, the contents of which are incorporated herein by reference in their entirety.

FIELD OF THE DISCLOSURE

This relates generally to compact input devices. In particular, this relates to input devices utilizing three conducting layers and formed on flexible substrates.

BACKGROUND

Several varieties of input devices exist for performing operations in portable electronic devices. Some examples of input devices include buttons, switches, keyboards, mice, trackballs, touch pads, joy sticks, touch screens and the like. Some examples of portable electronic devices include media players, remote controls, personal digital assistants (PDAs), cellular phones, etc.

A user can cause an operation to be performed in a portable electronic device by applying an input to an input device. In one example, a user can move a cursor displayed on a display screen of the portable electronic device by touching an input device in a particular motion. In another example, a user can select an item displayed on the display screen by pressing an input device in a particular location.

Designing input devices for portable devices presents some unique problems. For example, there is typically a push to increase the ability of portable devices and, thus, the number of functions that the input arrangements are able to perform. A competing concern is that there is also pressure to make portable computing devices smaller, and thus, more portable. However, as the size of these devices decreases, the amount of space in within the portable device to locate input devices also decreases.

Accordingly, a need exists for compact input devices that can be located within the limited space of a portable device.

SUMMARY

To minimize the space within a portable hand held electronic device utilizing a touch-based scroll wheel having a touch surface, the present disclosure provides an input device formed utilizing three or more conducting layers separated by a dielectric layer, such as polyamide or other plastic. The dielectric layers may be flexible to allow the input device to fold or bend to fit within the portable electronic device.

A first conducting layer may include sensors circumferentially arranged around a sensor area in a closed loop for determining the position of an object such as a finger on a touch surface. These sensors may be based on resistive sensing, surface acoustic wave sensing, pressure sensing (e.g., strain gauge), optical sensing, capacitive sensing and the like. The first conducting layer may also include some traces for routing the various electrical components of the input device. A second conducting layer may include traces. A third conducting layer may include grounding. In addition, the third conducting layer may include additional traces, and connections to one or more touch surface movement detectors, for example dome switches, and connections to a controller. The controller may be mounted on any layer of the input device either directly or with one or more layers in between, for example, the controller may be mounted on an adhesion or dielectric layer. Further, the relative positions of the conducting layers may be switched.

By including a second conducting layer that includes traces, the amount of area on the first and third conducting layers dedicated to traces may be reduced. This may result in an input device that has a smaller sensor/switch area and/or an input device that includes a lager sensor or switch area. In addition, if capacitive sensors are used for the sensors, by locating traces on another layer parasitic capacitance issues that may result when the traces are located too close to the sensors may be reduced.

The input device may also include routing and connections for an integrated circuit, such a controller mounted to the input device. The input device may also include connections for connecting the input device to other components, for example the main processor or circuit board of an electronic device. Different portions of the flexible input device may utilize less than three conducting layers, for example two layers or one conducting layers. When the number of conducting layers in certain areas is reduced, the number of dielectric layers between these conducting layers may similarly be reduced. By reducing the number of dielectric layers, the flexibility of the input device in these areas may be increased. This allows the two layer and one layer areas to flex or bend within an electronic device. The transition from three layers to two layers or one layer may be made using a non linear scallop or wave pattern for the dielectric substrate. By using a non-linear pattern, the stress at these points may be reduced and resulting delamination may be prevented.

DETAILED DESCRIPTION

The present disclosure describes embodiments of compact input devices formed on flexible substrates. The input devices may be formed using three or more conducting layers. By including three or more conducting layers, the diameter of the input device may be minimized. In addition, to improve the flexibility of portions of an input device mounted on a flexible substrate, some portions of the input device may be made to have fewer layers than other portions of the input device.

Reference to an element herein, for example, a sensor, a movement detector, or a trace, should be understood to mean one or more of the elements, such as one or more sensors, detectors or traces.

Figure 1:
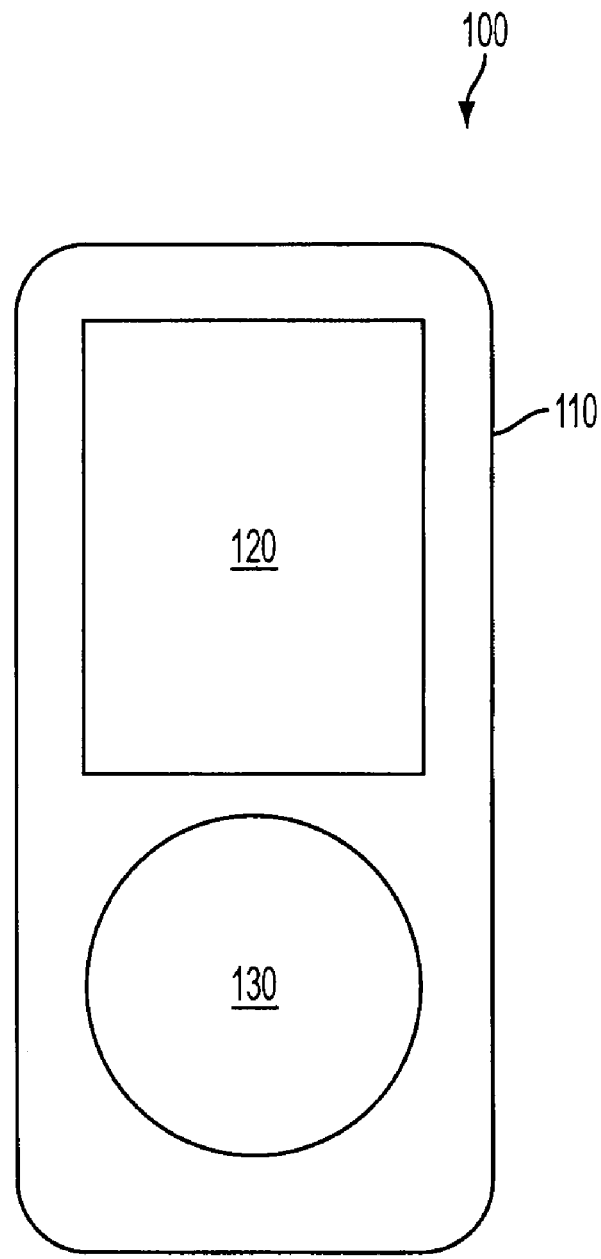
FIG. 1 illustrates an example of an electronic device.

FIG. 1 illustrates an example of an electronic device. The electronic device may be any consumer electronic product. The electronic device may be a computing device and more particularly it may be a media player, PDA, phone, remote control, camera and the like. In the embodiment illustrated in FIG. 1, the electronic device 100 may correspond to a media player. The term "media player" generally refers to computing devices dedicated to processing media such as audio, video or other images, including, for example, music players, game players, video players, video recorders and the like. These devices can be portable to allow a user to, for example, listen to music, play games or video, record video or take pictures wherever the user travels. In one embodiment, the electronic device can be a handheld device that is sized for placement into a pocket of the user. By being pocket sized, the device may be taken almost anywhere the user travels (e.g., the user is not limited by carrying a large, bulky and often heavy device, as in a portable computer). Furthermore, the device can be operated in the user's hands, thus no reference surface such as a desktop is required.

Electronic devices (e.g., media players) generally have connection capabilities that allow a user to upload and download data to and from a host device, such as a general purpose computer (e.g., desktop computer, portable computer, etc.). For example, in the case of a camera, photo images can be downloaded to the general purpose computer for further processing (e.g., printing). With regard to music players, for example, songs and play lists stored on the general purpose computer can be downloaded into the music player. In the embodiment illustrated in FIG. 1, electronic device 100 can be a pocket-sized hand-held media player (e.g., MP3 player) that allows a user to store a collection of music, photos, album art, contacts, calendar entries, and other desirable media assets. It should be appreciated however, that media players are not a limitation as the electronic device may be embodied in other forms as mentioned above.

As shown in FIG. 1, electronic device 100 may include housing 110 that can enclose various electrical components, such as integrated circuit chips and other circuitry, for example. The integrated circuit chips and other circuitry may include, for example, a microprocessor, memory (e.g., ROM, RAM), a power supply (e.g., battery), a circuit board, a hard drive or Flash (e.g., Nand flash) for storing media for example, one or more orientation detection elements (e.g., accelerometer) and various input/output (I/O) support circuitry. In the case of music players, the electrical components can include components for outputting music such as an amplifier and a digital signal processor (DSP) for example. In the case of video recorders or cameras the electrical components can include components for capturing images such as image sensors (e.g., charge coupled device (CCD) or complimentary oxide semiconductor (CMOS)) or optics (e.g., lenses, splitters, filters) for example. In addition to the above, the housing can also define the shape or form of the electronic device. That is, the contour of housing 102 may embody the outward physical appearance of electronic device 100 in one embodiment.

Electronic device 100 may also include display screen 120. Display screen 120 can be used to display a graphical user interface as well as other information to the user (e.g., text, objects, graphics). By way of example, display screen 120 may be a liquid crystal display (LCD). In one embodiment, the display screen can correspond to a X-by-Y pixel high-resolution display, with a white LED backlight to give clear visibility in daylight as well as low-light conditions. Display screen 120 can also exhibit a "wide screen" aspect ratio (e.g., similar to a 16:9 aspect ratio) such that it may be relatively easy to perceive portrait and landscape orientations.

Electronic device 100 may also include input device 130. Input device 130 can be configured to provide one or more control functions for controlling various applications associated with electronic device 100. For example, a control function can be used to move an object or perform an action on display screen 120 or to make selections or issue commands associated with operating electronic device 100. Input device 130 may be widely varied. In one embodiment, input device 130 can include a rigid sensor mechanism for detecting input. The rigid sensor mechanism can include, for example, a touch sensitive surface that provides location information for an object, such as a finger for example, in contact with or in proximity to the touch sensitive surface. In another embodiment, input device 130 can include one or more movable sensor mechanisms for detecting input. The movable sensor mechanism can include, for example, one or more moving members that actuate a switch when a particular area of input device 130 is pressed. The movable sensor mechanism may operate as a mechanical push button and perform a clicking action when actuated. In a further embodiment, input device 130 may include a combination of a rigid sensor mechanism and one or more movable sensor mechanisms.

An example of an input device comprising a rigid sensor mechanism may be found in U.S. Pat. No. 7,046,230 entitled "Touch Pad Handheld Device," which is incorporated herein by reference in its entirety. An example of an input device comprising a combination of a rigid sensor mechanism and a movable sensor mechanism may be found in U.S. patent application Ser. No. 11/812,383 entitled "Gimballed Scroll Wheel," filed Jun. 18, 2007, which is incorporated herein by reference in its entirety.

Figure 2:
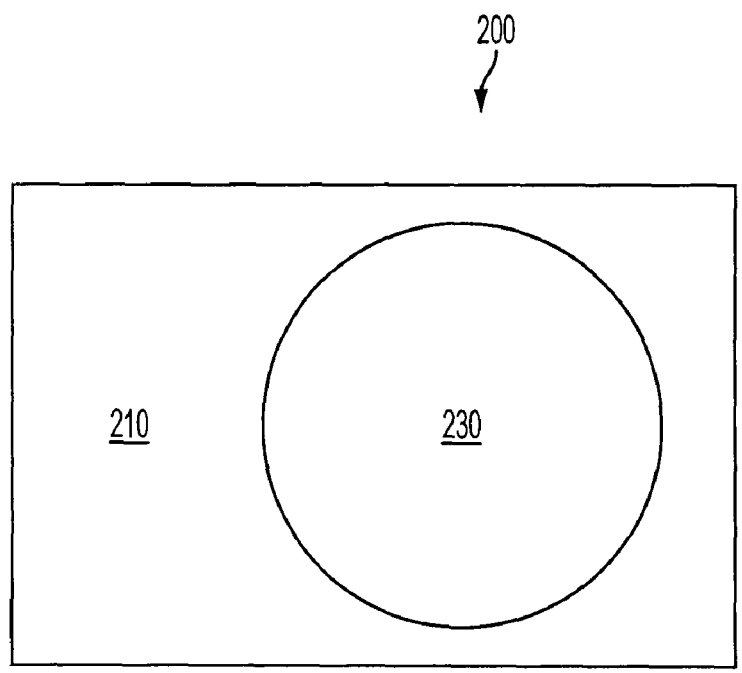
FIG. 2 illustrates an example of an electronic device.

FIG. 2 illustrates an embodiment of an electronic device without a display screen. In the embodiment illustrated in FIG. 2, electronic device 200 may include housing 210 that may generally correspond to housing 110, and input device 230 that may generally correspond to input device 130. The lack of a display screen allows electronic device 200 to be configured with smaller dimensions than those of electronic device 100. For example, in one embodiment, electronic device 200 may be less than two inches wide and less than two inches tall.

Figure 3:
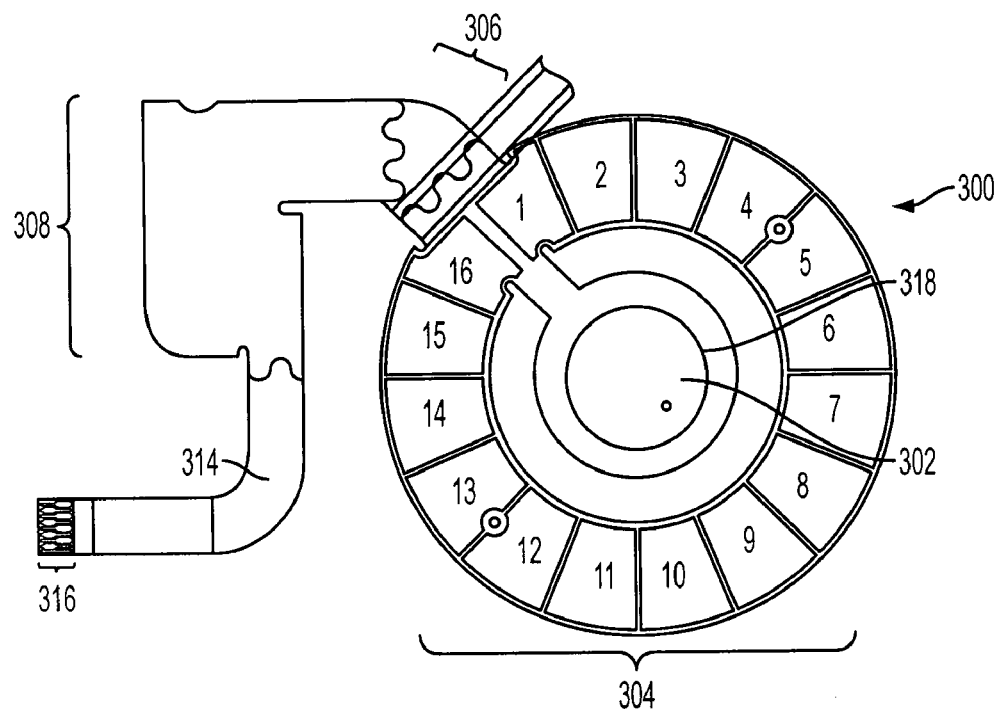
FIG. 3 illustrate an example of an input device formed on a flexible substrate.
Figure 4:
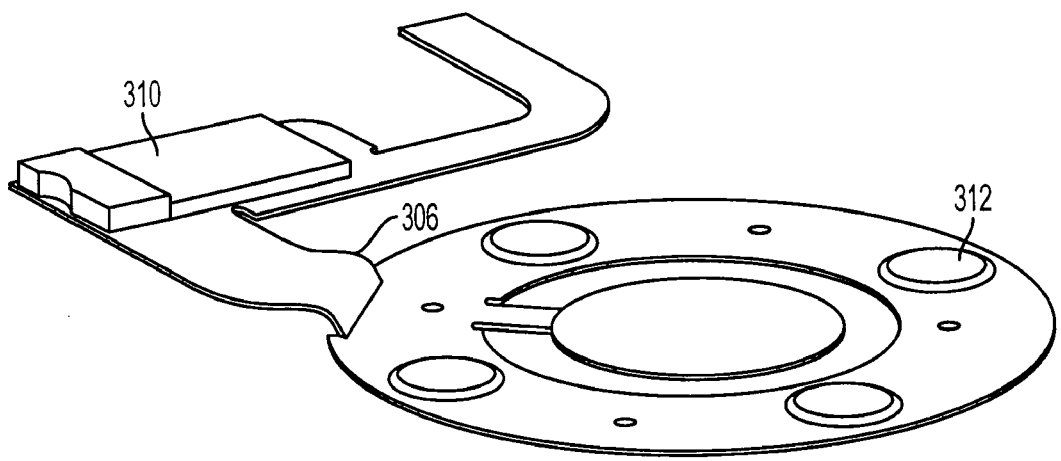
FIG. 4 illustrates an example of a different view of the input device of FIG. 3.

FIGS. 3 and 4 illustrates an example of an input device in the form of a click wheel. The input device illustrated in FIGS. 3 and 4 includes an arrangement of capacitive sensors on one side of the device and an arrangement of dome switches on the other side of the device.

FIG. 3 shows the side of the input device having capacitive sensor elements mounted on the top layer. This top layer of the input device can be mounted towards the outside of an electrical device to allow the sensors to be close to the object being sensed. FIG. 4 shows a bottom side of the same input device. This bottom side may include four dome switches 312. These dome switches may be configured to detect movements of the input device.

The input device 300 may include different areas that may include different numbers of conducting layers. The first area is sensor area 304 may include sensor elements 1-16 and dome switches 312. This area may be configured to sense touch events caused by an object, such as a finger, in contact with or in proximity to a touch sensitive surface placed over capacitive sensor elements 1-16. In addition, this area may be configured to sense movement of the sensor area using dome switches 312.

Sensor area 304 may include three conducting layers. The first conducting layer may include capacitive sensor elements 1-16, the second layer may include traces, and the third layer may include grounding and have dome switches 312 mounted thereto. Dielectric layers may be provided between the first and second layers and between the second and third layers. A dielectric cover layer may be included over the first and third layers to provide protection and insulate the sensor elements. The dielectric layers may be plastic layers, for example polyamide layers. In addition, the dielectric layers may include adhesives for attaching the different layers.

Touch events detectable using capacitive sensor elements 1-16 of input device 300 may be widely varied, and may include, for example, rotational motion, linear motion, taps, holds, and other gestures and any combinations thereof provided by one (single touch input) or more than one (multi-touch input) of a user's fingers across the touch sensitive surface. The capacitive sensor elements can be configured to detect input based on self capacitance or mutual capacitance. In self capacitance, the "self" capacitance of a single electrode is measured as for example relative to ground. In mutual capacitance, the mutual capacitance between at least first and second electrodes is measured. In either case, each of the sensor elements can work independent of the other sensor elements to produce simultaneously occurring signals representative of different points of input on the touch sensitive surface at a particular time. Controller 310 may be configured to detect inputs using sensor elements 1-16 by measuring a change in capacitance associated with each sensor element.

An example of an input device configured to detect multiple simultaneous touches or near touches may be found in U.S. patent application Ser. No. 10/840,862 entitled "Multi-point Touchscreen," filed May 6, 2004, which is incorporated herein by reference in its entirety. An example of a touch event model that can be associated with such an input device may be found in U.S. patent application Ser. No. 12/042,318 entitled "Touch Event Model," filed Mar. 4, 2008, which is incorporated herein by reference in its entirety. An example of gestures that may be implemented on such an input device may be found in U.S. patent application Ser. No. 11/818,342 entitled "Gestures for Controlling, Manipulating, and Editing of Media Files Using Touch Sensitive Devices," filed Jun. 13, 2007, which is incorporated herein by reference in its entirety.

The second area is center button area 302 including center sensor element 318. Center sensor element 318 may be configured as a movable button-type sensor element. In an alternative embodiment, the center sensor element 318 may be configured as a capacitive sensor element or as both a capacitive sensor element and a movable button-type sensor element.

The center sensor area 302 may include three layers. Alternatively, the center sensor area 302 may include only two or one conducting layer(s) and a corresponding fewer number of dielectric layers separating these conducting layer(s) to allow this area to be more flexible and allow center button area 302 to move more easily relative to sensor area 304.

The input device 300 may also include controller area 308. Controller area 308 may have controller 310, for controlling sensor elements 1-16, the dome switches 312 and the center sensor element 320, mounted thereto. This area may include three conducting layers to minimize the area of controller area 308. Using three layers minimizes the area around controller 310 utilized for traces and connections.

Controller area 308 may be connected to sensor area 304 via neck portion 306. Neck portion 306 may include fewer conducting layers and dielectric layers than sensor area 304 or controller area 308 to allow this area to be more flexible. For example, this area may include two or one conducting layers and a correspondingly fewer number of dielectric layers for separating the conducting layers. As shown in FIG. 4, by utilizing fewer conducting and dielectric layers this area may be made more flexible to allow it to be folded allowing sensor area 304 to project toward an outside surface of an electronic device. As shown in FIG. 3, the transitions from three conducting layers down to two or one layer(s) at neck portion 306 may be made using a non-linear, scallop or wave pattern on the dielectric substrate. By using this scallop pattern, the stress at the transition may be reduced.

The input device may also include tail portion 314. Tail portion 314 may terminate in a connector such as ZIF connector 316. The tail portion 314 allows the input device to connect to the main processor or circuit board of an electronic device. Tail portion 314 may include fewer conducting layers than controller area 308 to allow this area to be more flexible. For example, this area may include two or one conducting layers and a correspondingly fewer number of dielectric layers separating the conducting layers. The tail portion may be folded within the device allowing this portion to take up less area within the electronic device. As shown in FIG. 3 the transitions from three layers down to two or one layer(s) at tail portion 314 may be made in a non-linear, scallop or wave pattern on the dielectric substrate. By using this scallop pattern, the stress at the transition may be reduced.

Figure 5:
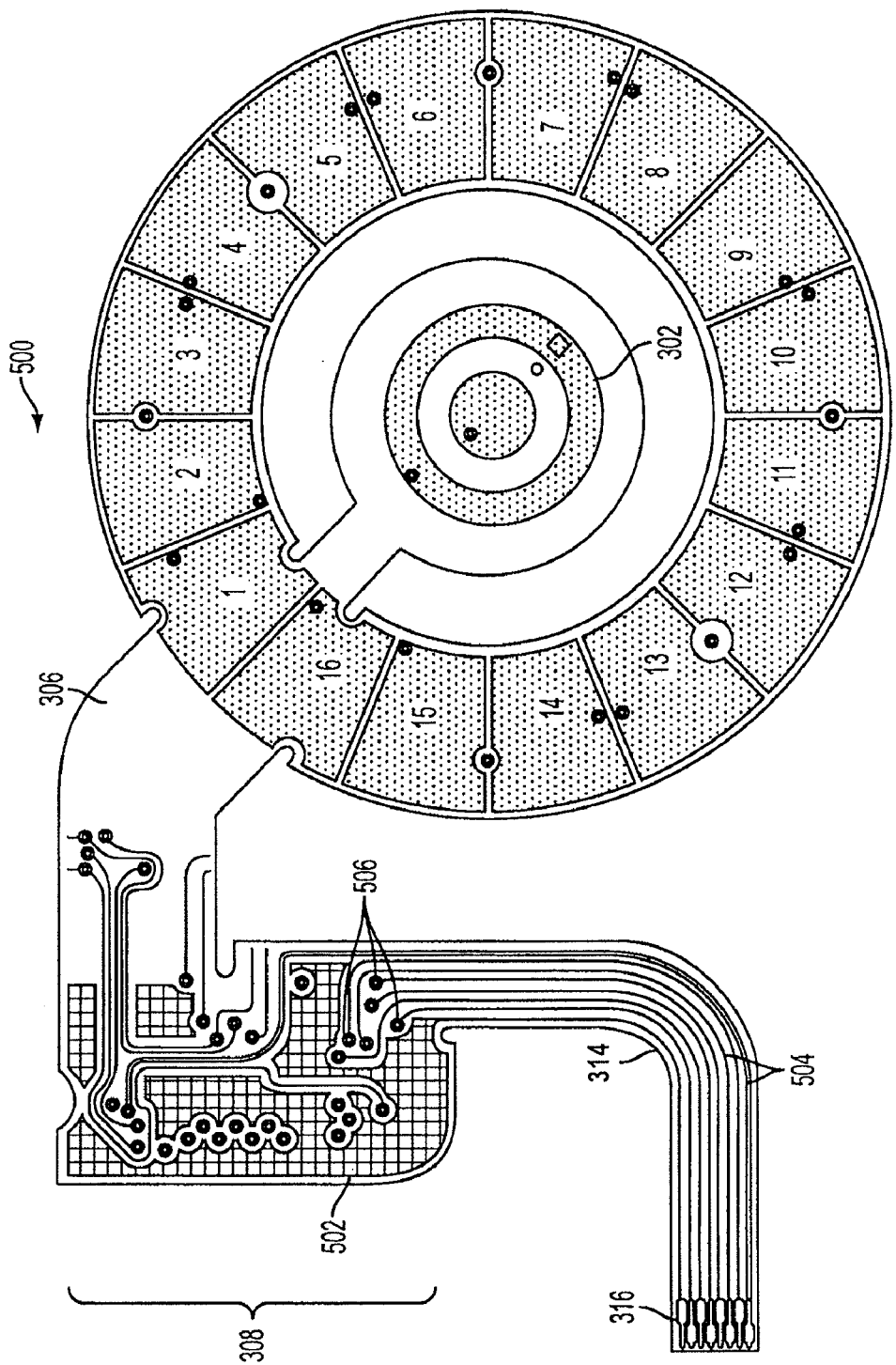
FIG. 5 illustrates an example of a first layer of an input device.

FIG. 5 is a diagram of the first conducting layer of the input device. The first layer may include the capacitive sensors 1-16. This diagram also shows the center button dome switch 302 mounted on this layer. The center button dome switch 302 may be covered with a laminate. Dome switches including a hole in the dome to allow the gas to escape when the dome is collapsed during activation. The center button portion may be laminated with a coating to prevent ESD problems involving the button. Because the dome switch is laminated, the hole in the dome switch which permits air to escape when depressed may be sealed. Accordingly, a hole may be drilled in from the bottom layers through the top first layer to allow air to pass out the bottom layer when the switch is depressed.

The grid portions 502 in FIG. 5 are ground fill. Neck portion 306 may not include any conducting elements in this layer. Accordingly, the neck portion may not include the first conducting layer. Also on this layer are traces 504 on tail portion 314. Traces 504 may connect controller 310 to the main processor or circuit board of an electronic device using ZIF connector 316. Traces 504 may be connected to the controller 310 using vias 506.

Figure 6:
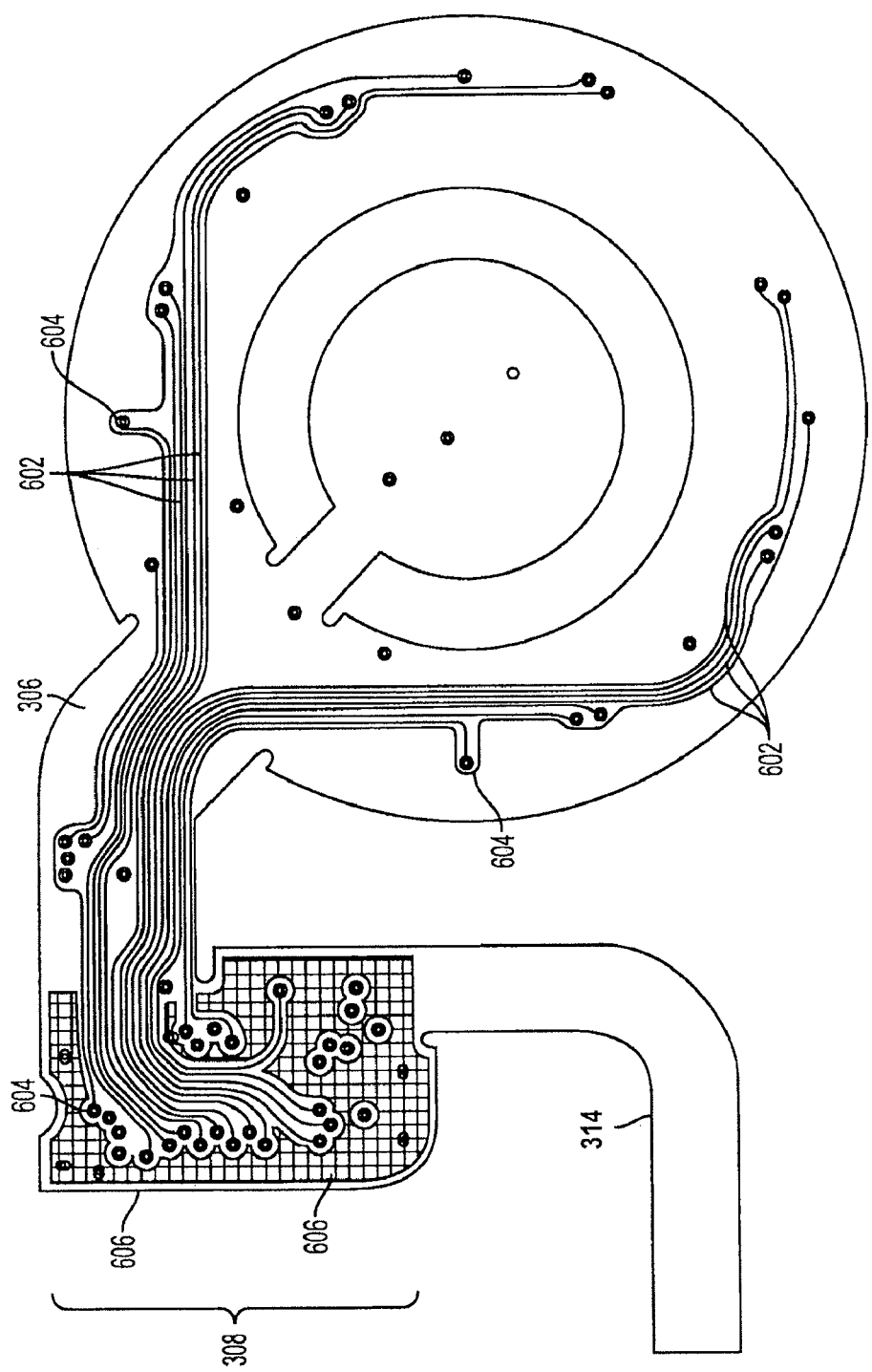
FIG. 6 illustrates an example of a second layer of an input device.

FIG. 6 is a diagram of the second or middle conducting layer of the input device. The middle layer may contain traces 602 for connecting one or more capacitive sensors 1-16 and circumferentially placed dome switches 312 to controller 310. The traces may be connected to capacitive sensors 1-16, dome switches 312 and controller 310 using vias 604. An advantage of routing traces in this layer is that less area may be utilized in the first and third conducting layers for routing traces. In addition, parasitic capacitance, which can reduce the performance of the capacitance sensors 1-16, may be reduced. This layer may include traces through neck area 306 and ground fill 606 in controller area 308. Tail portion 314 may not include any conducting elements in this layer. Accordingly, the tail portion 314 may not include the second conducting layer.

Figure 7:
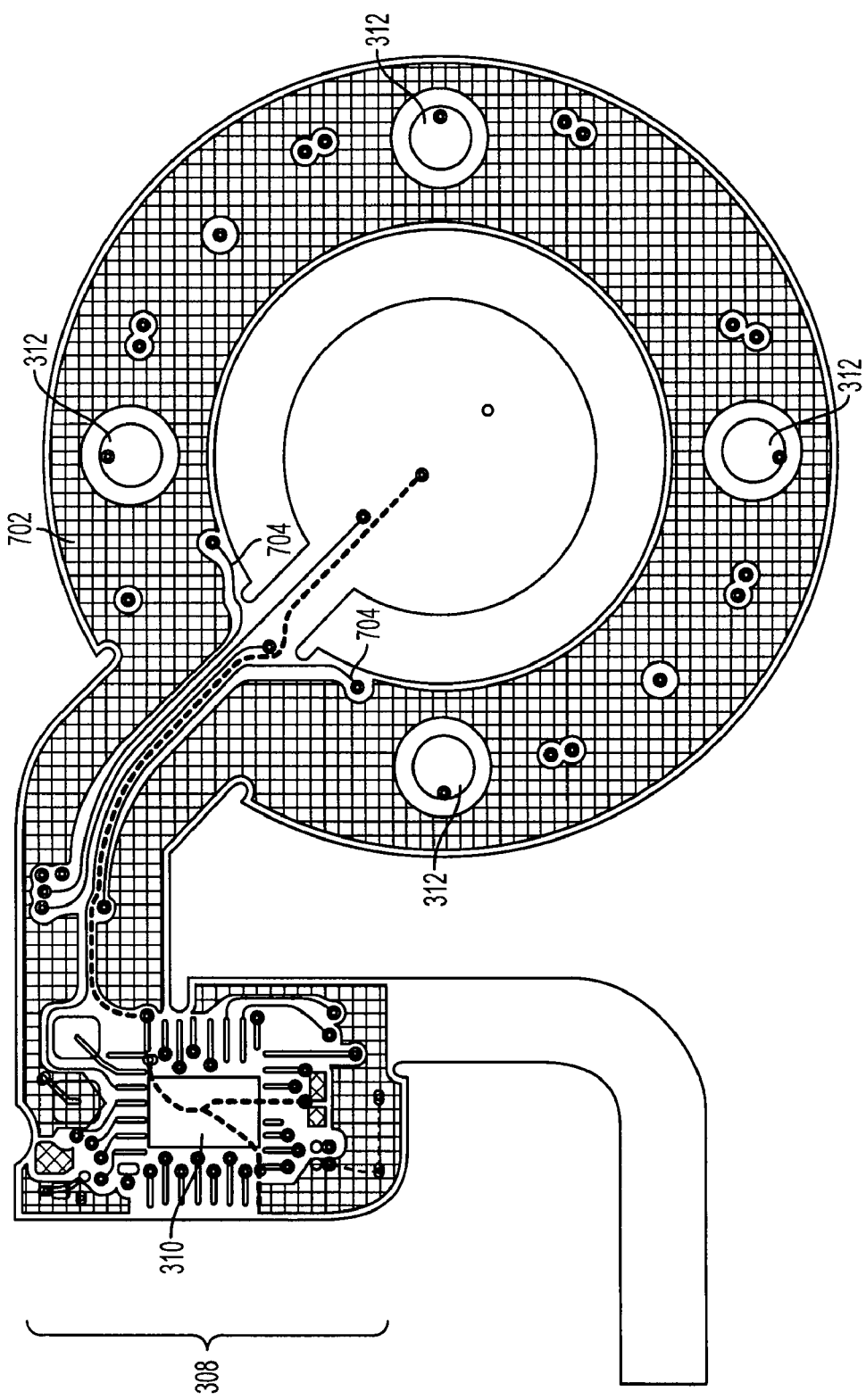
FIG. 7 illustrates an example of a third layer of an input device.

FIG. 7 is a diagram of the third conducting layer of the input device. The third layer may include grounding 702, traces 704 and 706, and have dome switches 312 and controller 310 attached thereto. Note the trace 706 in the third layer may be coupled to center button dome switch 706 and traces 704 may be coupled to three capacitive sensors 1-16. Tail portion 314 may not include any conducting elements in this layer. Accordingly, the tail portion 314 may not include the third conducting layer.

Figure 8:
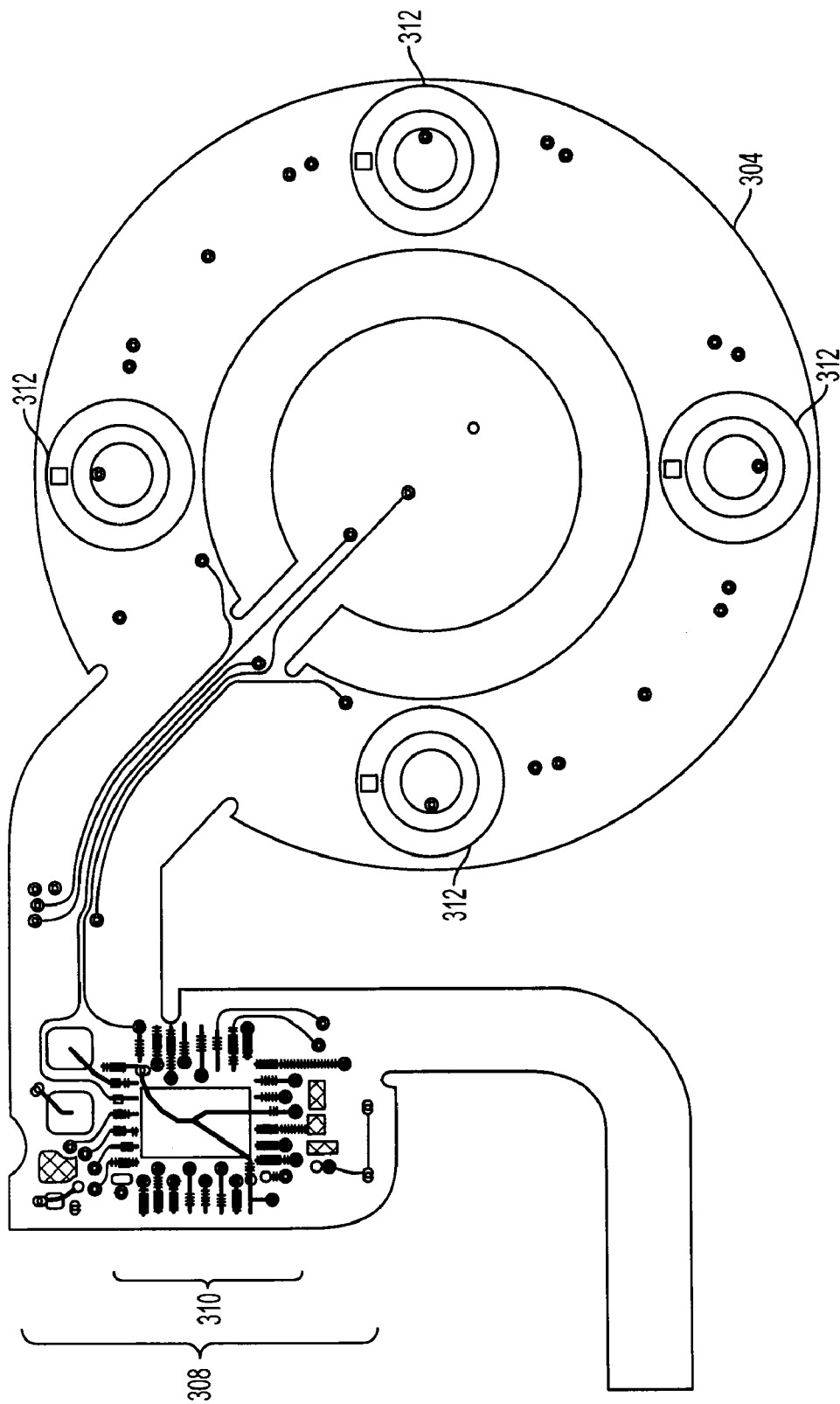
FIG. 8 illustrates an example of a different view of the third layer of the input device of FIG. 7, with the ground hidden.

FIG. 8 is a diagram of the third conducting layer of the input device with the grounding 702 removed. As shown in FIG. 8, the circumferentially arranged dome switches 312 may placed near the edge of sensor area 304 since space for routing these dome switches may be unnecessary since the traces for routing these dome switches may be located on the second conducting layer. Similarly, traces for connecting controller 310 to capacitive sensors 1-16 and dome switches 312 may be located in another layer allowing controller 310 to be mounted near the edge of controller area 308.

Figure 9:
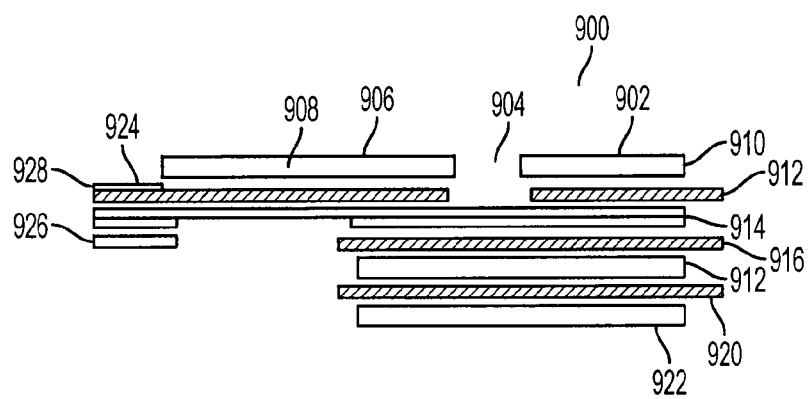
FIG. 9 illustrates an example of a cross section of a three conducting layer stackup.

FIG. 9 is a diagram of a cross section of a three conducting layer stackup 900 with portions of the stackup including only two or one conducting layer(s). In FIG. 9, portions 902 and 906 may correspond to sensor area 304 and controller area 308 respectively, which may have all three conducting layers. Portion 904 may correspond to neck portion 306, which may have only two conducting layers to improve flexibility in this area. Portion 908 may correspond to tail portion 314, which may only have one conducting layer to allow the tail to be even more flexible.

In FIG. 9, layer 910 may be a dielectric coverlay layer and an adhesive for attaching the coverlay material to a first conducting layer 912. Layer 914 may be a polyamide dielectric layer and an adhesive for attaching the polyamide dielectric material to second conducting layer 916. Layer 916 may be a polyamide dielectric layer and an adhesive for attaching the polyamide dielectric material to third conducting layer 920. Layer 922 may be a dielectric coverlay layer and an adhesive for attaching the coverlay to the third conducting layer 920.

Portion 924, may correspond to a ZIF connector for connecting the tail portion 908 to the electronic device. This portion may include gold contacts 928 and a stiffener 926.

The stackup may be made utilizing a dielectric substrate with a copper layer coated thereon. The copper layer may be etched and then glued to another dielectric substrate with an etched copper layer. This process may be repeated until the desired number of copper/conducting layers is achieved.

The examples described herein disclose separate coating layers, sheets, levels or tiers within the input device stackup. Such separate coating layers, sheets, levels, tiers or other similar structures may be referred to as "layers."

Figure 10:
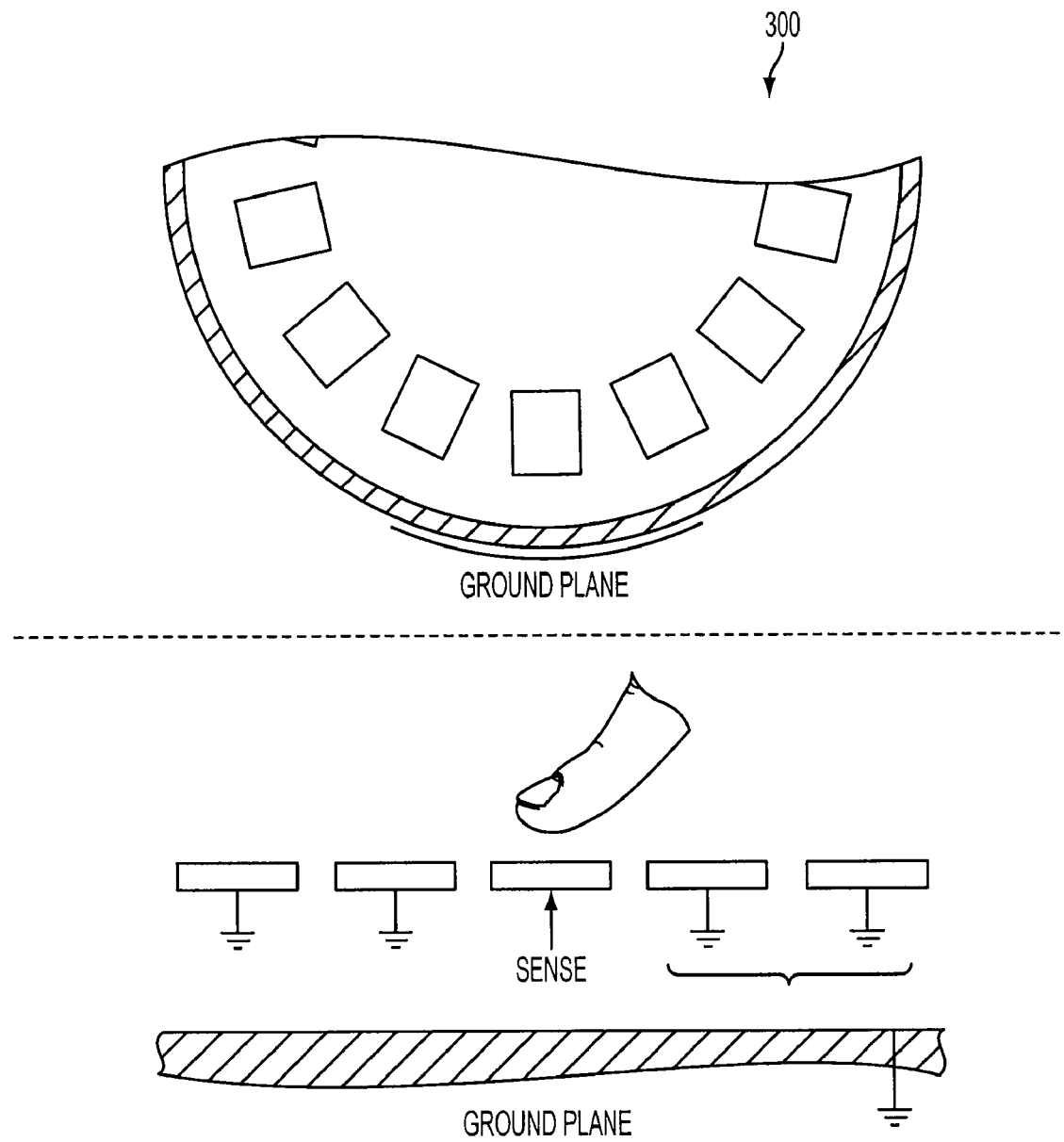
FIG. 10 illustrates an example of a sensing process.

FIG. 10 illustrates an example of a sensing process utilizing the input device in accordance with one embodiment. During one scan, controller 310 can perform a sensing operation for each of sensor elements 1-16 in consecutive fashion. When a sensing operation is being performed in association with one of the sensor elements, all other sensor elements can be grounded. In one embodiment, sensor elements can be disposed on a three-layer flexible printed circuit as previously described.

Figure 11:
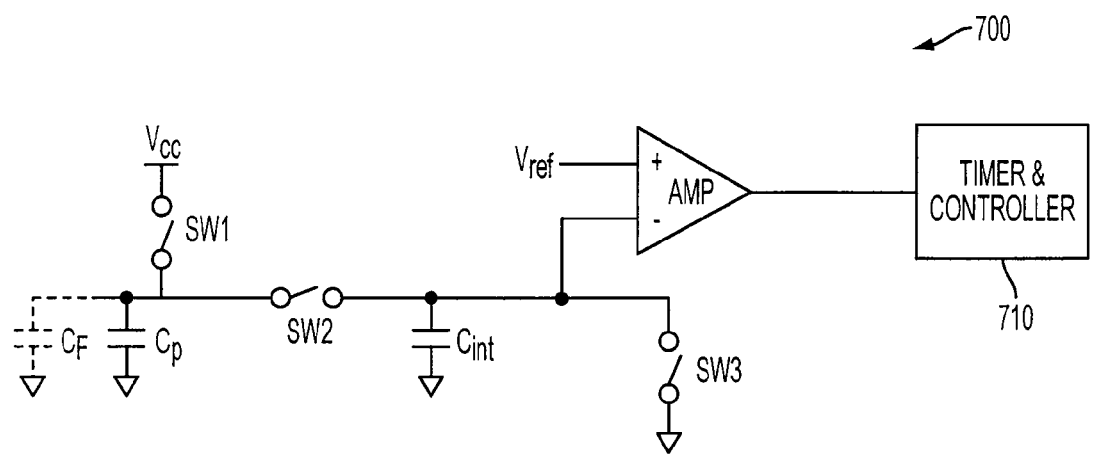
FIG. 11 illustrates an example of a sensing circuit.

FIG. 11 illustrates an example of a sensing circuit that can implement the sensing process of FIG. 10. A parasitic capacitance Cp can represent the sum of all capacitance from a sensor element associated with a sensing operation to surrounding conductive material (e.g., sensor element to ground plane and sensor element to grounded sensor elements). The capacitance Cf associated with an object such as a finger over the sensor element can increase the total capacitance C (C=Cp+Cf) associated with the sensor element above the threshold sense level. Time and controller 710 of sensing circuit 700 can measure a capacitance associated with a sensor element by using relatively small capacitance Cp+Cf to charge relatively large capacitance Cint to voltage threshold Vref. Sensing circuit 700 can produce a measurement value reflecting how long it takes (e.g., how may switching cycles as described below) to charge Cint to Vref. For example, a measurement value reflecting an input (e.g., the above input sense level values) can result from the time it takes for Cp+Cf to charge Cint to Vref minus the time it takes for Cp to charge Cint to Vref. Expressed formulaically, input=time(Cp+Cf)–time(Cp).

In operation, sensing circuit 700 can operate as follows:

step 0: reset and start timer (assume Cint has no charge)

step 1: open transfer switch SW2, close charge switch SW1 (these can switch alternately very fast, e.g., MHz)

Cp+Cf are charged to Vcc (e.g., 3.0 V)

step 2: open charge switch SW1, close transfer switch SW2

Figure 12A:
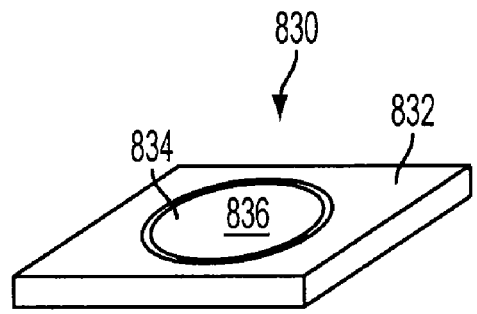
FIGS. 12A-12C illustrate an example of operations of an input device.
Figure 12B:
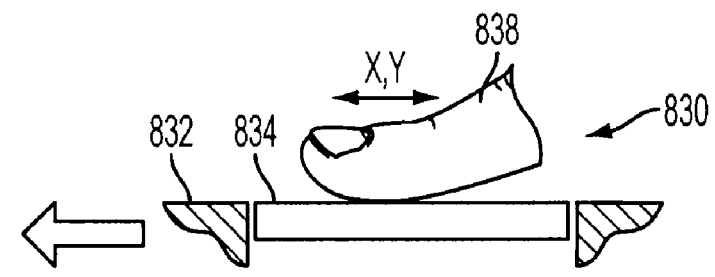
Figure 12C:
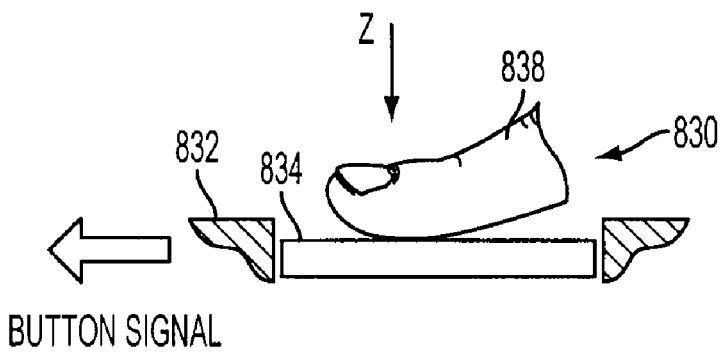

Cp+Cf charge flows to Cint repeat step 1 and step 2 until Cint reaches Vref (e.g., 1.1 V)

step 3: stop timer step 4: open charge switch SW1, open transfer switch SW2, close discharge switch SW3: discharges Cint to no charge state open discharge switch SW3 when done repeat for all sensor elements FIGS. 12A-12C illustrate operations of an input device according to some embodiments of the present disclosure. By way of example, the input device may generally correspond to any of the input devices mentioned above. In the example shown in FIG. 12A, input device 830 can be configured to send information or data to an electronic device in order to perform an action on a display screen (e.g., via a graphical user interface). Examples of actions that may be performed include, moving an input pointer, making a selection, providing instructions, etc. The input device can interact with the electronic device through a wired connection (e.g., cable/connector) or a wireless connection (e.g., IR, Bluetooth, etc.). Input device 830 may be a stand alone unit or it may be integrated into the electronic device. As a stand alone unit, the input device can have its own enclosure. When integrated into an electronic device, the input device can typically use the enclosure of the electronic device. In either case, the input device can be structurally coupled to the enclosure, as for example, through screws, snaps, retainers, adhesives and the like. In some cases, the input device may be removably coupled to the electronic device, as for example, through a docking station. The electronic device to which the input device may be coupled can correspond to any consumer related electronic product. By way of example, the electronic device can correspond to a computer such as a desktop computer, laptop computer or PDA, a media player such as a music player, a communication device such as a cellular phone, another input device such as a keyboard, and the like.

As shown in FIG. 12A, in this embodiment input device 830 may include frame 832 (or support structure) and touch pad 834. Frame 832 can provide a structure for supporting the components of the input device. Frame 832 in the form of a housing can also enclose or contain the components of the input device. The components, which may include touch pad 834, can correspond to electrical, optical and/or mechanical components for operating input device 830. Frame 832 may be a separate component or it may be an integral component of the housing of the electronic device.

Touch pad 834 can provide location information for an object, such as a finger for example, in contact with or in proximity to the touch pad. This information can be used in combination with information provided by a movement indicator to generate a single command associated with the movement of the touch pad. The touch pad may be used as an input device by itself; for example, the touch pad may be used to scroll through a list of items on the device.

The shape, size and configuration of touch pad 834 may be widely varied. In addition to the touchpad configurations disclosed above, a conventional touch pad based on the Cartesian coordinate system, or based on a Polar coordinate system can be configured to provide scrolling using rotational movements and can be configured to accept the multi-touch and gestures, for example those described herein. An example of a touch pad based on polar coordinates may be found in U.S. Pat. No. 7,046,230 which is incorporated by reference above. Furthermore, touch pad 834 can be used in at least two different modes, which may be referred to as a relative mode and an absolute mode. In absolute mode, touch pad 834 can, for example, report the absolute coordinates of the location at which it may be touched. For example, these would be "x" and "y" coordinates in the case of a standard Cartesian coordinate system or $(r,\theta)$ in the case of a Polar coordinate system. In relative mode, touch pad 834 can report the direction and/or distance of change, for example, left/right, up/down, and the like. In most cases, the signals produced by touch pad 834 can direct movement on the display screen in a direction similar to the direction of the finger as it may be moved across the surface of touch pad 834.

Further examples of touch pad configurations may be found in U.S. patent application Ser. No. 10/949,060 entitled "Raw Data Track Pad Device and System," filed Sep. 24, 2004, U.S. patent application Ser. No. 11/203,692 entitled "Method of Increasing the Spatial Resolution of Touch Sensitive Devices," filed Aug. 15, 2005, and U.S. patent application Ser. No. 11/818,395 entitled "Touch Screen Stack-Ups," filed Jun. 13, 2007, all of which are incorporated herein by reference in their entireties.

Further examples of touch pad sensing may be found in U.S. patent application Ser. No. 10/903,964 entitled "Gestures for Touch Sensitive Input Devices," filed Jul. 30, 2004, U.S. patent application Ser. No. 11/038,590 entitled "Mode-Based Graphical User Interfaces for Touch Sensitive Input Devices," filed Jan. 18, 2005, U.S. patent application Ser. No. 11/048,264 entitled "Gestures for Touch Sensitive Input Devices," filed Jan. 31, 2005, U.S. patent application Ser. No. 11/232,299 entitled "System and Method for Processing Raw Data of Track Pad Device," filed Sep. 21, 2005, and U.S. patent application Ser. No. 11/619,464 entitled "Multi-Touch Input Discrimination," filed Jan. 3, 2007, all of which are incorporated herein by reference in their entireties.

The shape of touch pad 834 may be widely varied. For example, it may be circular, oval, square, rectangular, triangular, and the like. In general, the outer perimeter can define the working boundary of touch pad 834. In the embodiment illustrated in FIG. 12, the touch pad may be circular. Circular touch pads can allow a user to continuously swirl a finger in a free manner, i.e., the finger may be rotated through 360 degrees of rotation without stopping. This form of motion can produce incremental or accelerated scrolling through a list of songs being displayed on a display screen, for example. Furthermore, the user may rotate his or her finger tangentially from all sides, thus providing more finger position range. Both of these features may help when performing a scrolling function. Furthermore, the size of touch pad 834 can accommodate manipulation by a user (e.g., the size of a finger tip or larger).

Touch pad 834, which can generally take the form of a rigid platform. The rigid platform may be planar, convex or concave, and may include touchable outer surface 836, which may be textured, for receiving a finger or other object for manipulation of the touch pad. Although not shown in FIG. 12A, beneath touchable outer surface 836 can be a sensor arrangement that may be sensitive to such things as the pressure and movement of a finger thereon. The sensor arrangement may typically include a plurality of sensors that can be configured to activate as the finger sits on, taps on or passes over them. In the simplest case, an electrical signal can be produced each time the finger is positioned over a sensor. The number of signals in a given time frame may indicate location, direction, speed and acceleration of the finger on touch pad 834, i.e., the more signals, the more the user moved his or her finger. In most cases, the signals can be monitored by an electronic interface that converts the number, combination and frequency of the signals into location, direction, speed and acceleration information. This information can then be used by the electronic device to perform the desired control function on the display screen. The sensor arrangement may be widely varied. By way of example, the sensors can be based on resistive sensing, surface acoustic wave sensing, pressure sensing (e.g., strain gauge), optical sensing, capacitive sensing and the like.

In the embodiment illustrated in FIG. 12, touch pad 834 may be based on capacitive sensing. In most cases, the capacitive touch pad may include a protective shield, one or more electrode layers, a circuit board and associated electronics including an application specific integrated circuit (ASIC). The protective shield can be placed over the electrodes, the electrodes can be mounted on the top surface of the circuit board, and the ASIC can be mounted on the bottom surface of the circuit board. The protective shield may serve to protect the underlayers and to provide a surface for allowing a finger to slide thereon. The surface may generally be smooth so that the finger does not stick to it when moved. The protective shield also may provide an insulating layer between the finger and the electrode layers. The electrode layer may include a plurality of spatially distinct electrodes. Any suitable number of electrodes can be used. As the number of electrodes increases, the resolution of the touch pad also increases.

In accordance with one embodiment, touch pad 834 can be movable relative to the frame 832. This movement can be detected by a movement detector that generates another control signal. By way of example, touch pad 834 in the form of the rigid planar platform can rotate, pivot, slide, translate, flex and/or the like relative to frame 832. Touch pad 834 can be coupled to frame 832 and/or it can be movably restrained by frame 832. By way of example, touch pad 834 can be coupled to frame 832 through axles, pin joints, slider joints, ball and socket joints, flexure joints, magnets, cushions and/or the like. Touch pad 834 can also float within a space of the frame (e.g., gimbal). It should be noted that input device 830 may additionally include a combination of joints such as a pivot/translating joint, pivot/flexure joint, pivot/ball and socket joint, translating/flexure joint, and the like to increase the range of movement (e.g., increase the degree of freedom).

When moved, touch pad 834 can be configured to actuate a movement detector circuit that generates one or more signals. The circuit may generally include one or more movement detectors such as switches, sensors, encoders, and the like.

In the embodiment illustrated in FIG. 12, touch pad 834 can be part of a depressible platform. The touch pad can operate as a button and perform one or more mechanical clicking actions. Multiple functions or the same function of the device may be accessed by depressing the touch pad 834 in different locations. A movement detector signals that touch pad 834 has been depressed, and touch pad 834 signals a location on the platform that has been touched. By combining both the movement detector signals and touch pad signals, touch pad 834 acts like multiple buttons such that depressing the touch pad at different locations corresponds to different buttons. As shown in FIGS. 12B and 12C, according to one embodiment touch pad 834 can be capable of moving between an upright position (FIG. 12B) and a depressed position (FIG. 12C) when a requisite amount of force from finger 838, palm, hand or other object is applied to touch pad 834. Touch pad 834 can be spring biased in the upright position, as for example through a spring member. Touch pad 834 moves to the depressed position when the spring bias is overcome by an object pressing on touch pad 834.

As shown in FIG. 12B, touch pad 834 generates tracking signals when an object such as a user's finger is moved over the top surface of the touch pad in the x, y plane. As shown in FIG. 12C, in the depressed position (z direction), touch pad 834 generates positional information and a movement indicator generates a signal indicating that touch pad 834 has moved. The positional information and the movement indication can be combined to form a button command. Different button commands or the same button command can correspond to depressing touch pad 834 in different locations. The button commands may be used for various functionalities including, but not limited to, making selections or issuing commands associated with operating an electronic device. By way of example, in the case of a music player, the button commands may be associated with opening a menu, playing a song, fast forwarding a song, seeking through a menu and the like.

To elaborate, touch pad 834 can be configured to actuate a movement detector, which together with the touch pad positional information, can form a button command when touch pad 834 is moved to the depressed position. The movement detector can be located within frame 832 and coupled to touch pad 834 and/or frame 832. The movement detector may be any combination of switches and sensors. Switches can be generally configured to provide pulsed or binary data such as activate (on) or deactivate (off). By way of example, an underside portion of touch pad 834 can be configured to contact or engage (and thus activate) a switch when the user presses on touch pad 834. The sensors, on the other hand, can be generally configured to provide continuous or analog data. By way of example, the sensor can be configured to measure the position or the amount of tilt of touch pad 834 relative to the frame when a user presses on the touch pad 834. Any suitable mechanical, electrical and/or optical switch or sensor may be used. For example, tact switches, force sensitive resistors, pressure sensors, proximity sensors, and the like may be used. In some case, the spring bias for placing touch pad 834 in the upright position may be provided by a movement detector that includes a spring action. In other embodiments, input device 830 can include one or more movement detectors in various locations positioned under and/or above touch pad 834 to form button commands associated with the particular locations in which the movement detector is actuated.

Touch pad 834 may also be configured to provide a force feedback response. An example of touch pad configuration providing a haptic feedback response may be found in U.S. Pat. No. 6,337,678 entitled "Force Feedback Computer Input and Output Device with Coordinated Haptic Elements," which is incorporated herein by reference in its entirety.

Figure 13:
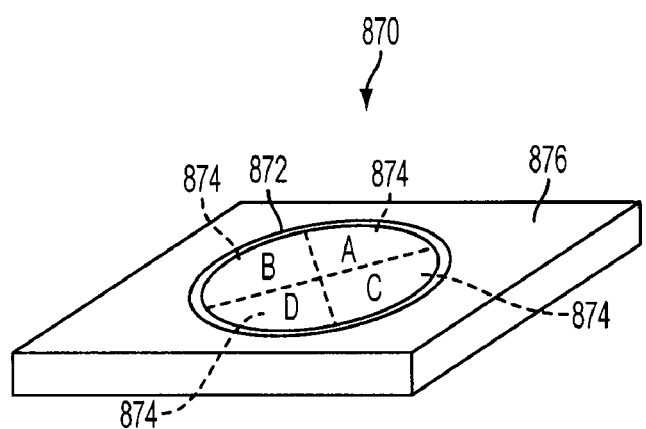
FIG. 13 illustrates an example of an input device.

FIG. 13 illustrates a simplified perspective diagram of input device 870. Like the input device shown in the embodiment of FIGS. 12A-12C, this input device 870 incorporates the functionality of one or more buttons directly into touch pad 872, i.e., the touch pad acts like a button. In this embodiment, however, touch pad 872 can be divided into a plurality of independent and spatially distinct button zones 874. Button zones 874 may represent regions of the touch pad 872 that can be moved by a user to implement distinct button functions or the same button function. The dotted lines may represent areas of touch pad 872 that make up an individual button zone. Any number of button zones may be used, for example, two or more, four, eight, etc. In the embodiment illustrated in FIG. 13, touch pad 872 may include four button zones 874 (i.e., zones A-D).

As should be appreciated, the button functions generated by pressing on each button zone may include selecting an item on the screen, opening a file or document, executing instructions, starting a program, viewing a menu, and/or the like. The button functions may also include functions that make it easier to navigate through the electronic system, as for example, zoom, scroll, open different menus, home the input pointer, perform keyboard related actions such as enter, delete, insert, page up/down, and the like. In the case of a music player, one of the button zones may be used to access a menu on the display screen, a second button zone may be used to seek forward through a list of songs or fast forward through a currently playing song, a third button zone may be used to seek backwards through a list of songs or fast rearward through a currently playing song, and a fourth button zone may be used to pause or stop a song that may be in the process of being played.

To elaborate, touch pad 872 can be capable of moving relative to frame 876 so as to create a clicking action. Frame 876 can be formed from a single component or a combination of assembled components. The clicking action can actuate a movement detector contained inside frame 876. The movement detector can be configured to sense movements of the button zones during the clicking action and to send a signal corresponding to the movement to the electronic device. By way of example, the movement detectors may be switches, sensors and/or the like.

In addition, touch pad 872 can be configured to send positional information on what button zone may be acted on when the clicking action occurs. The positional information can allow the device to determine which button zone to activate when the touch pad is moved relative to the frame.

The movements of each of button zones 874 may be provided by various rotations, pivots, translations, flexes and the like. In one embodiment, touch pad 872 can be configured to gimbal relative to frame 876. By gimbal, it is generally meant that the touch pad 872 can float in space relative to frame 876 while still being constrained thereto. The gimbal can allow the touch pad 872 to move in single or multiple degrees of freedom (DOF) relative to the housing, for example, movements in the x, y and/or z directions and/or rotations about the x, y, and/or z axes ($\theta x \theta y \theta z$).

Figure 14:
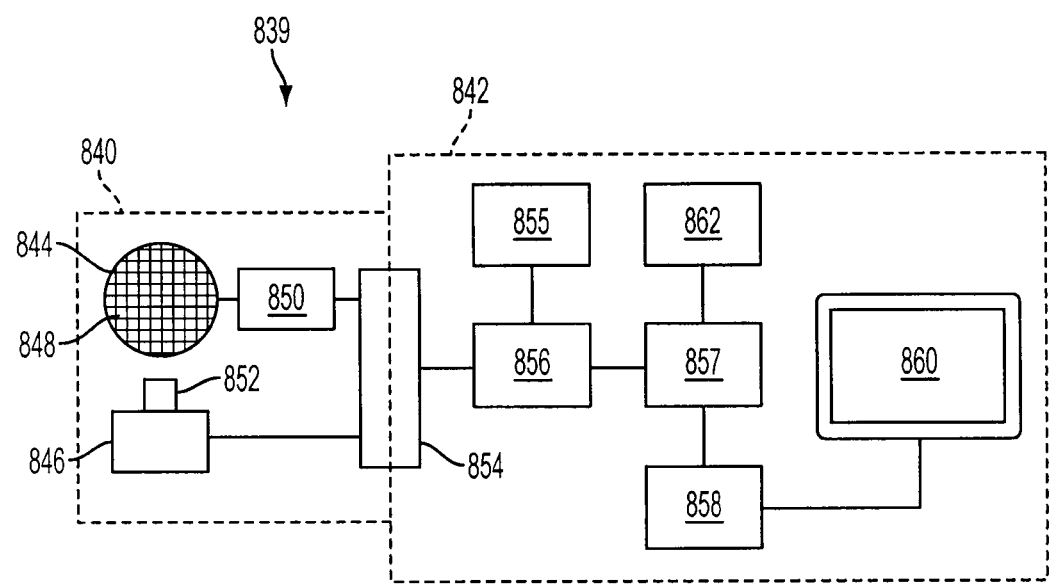
FIG. 14 illustrates an example of a computing system.

FIG. 14 illustrates an example of a simplified block diagram of a computing system 839. The computing system may generally include input device 840 operatively connected to computing device 842. By way of example, input device 840 can generally correspond to input device 830 shown in FIGS. 12A-12C, and the computing device 842 can correspond to a computer, PDA, media player or the like. As shown, input device 840 may include depressible touch pad 844 and one or more movement detectors 846. Touch pad 844 can be configured to generate tracking signals and movement detector 846 can be configured to generate a movement signal when the touch pad is depressed. Although touch pad 844 may be widely varied, in this embodiment, touch pad 844 can include capacitance sensors 848 and control system 850 (which can generally correspond to the controller 310 described above) for acquiring position signals from sensors 848 and supplying the signals to computing device 842. Control system 850 can include an application specific integrated circuit (ASIC) that can be configured to monitor the signals from sensors 848, to compute the absolute location, angular location, direction, speed and/or acceleration of the monitored signals and to report this information to a processor of computing device 842. Movement detector 846 may also be widely varied. In this embodiment, however, movement detector 846 can take the form of a switch that generates a movement signal when touch pad 844 is depressed. Movement detector 846 can correspond to a mechanical, electrical or optical style switch. In one particular implementation, movement detector 846 can be a mechanical style switch that includes protruding actuator 852 that may be pushed by touch pad 844 to generate the movement signal. By way of example, the switch may be a tact or dome switch.

Both touch pad 844 and movement detector 846 can be operatively coupled to computing device 842 through communication interface 854. The communication interface provides a connection point for direct or indirect connection between the input device and the electronic device. Communication interface 854 may be wired (wires, cables, connectors) or wireless (e.g., transmitter/receiver).

Referring to computing device 842, it may include processor 857 (e.g., CPU or microprocessor) configured to execute instructions and to carry out operations associated with computing device 842. For example, using instructions retrieved from memory, the processor can control the reception and manipulation of input and output data between components of computing device 842. Processor 857 can be configured to receive input from both movement detector 846 and touch pad 844 and can form a signal/command that may be dependent upon both of these inputs. In most cases, processor 857 can execute instruction under the control of an operating system or other software. Processor 857 may be a single-chip processor or may be implemented with multiple components.

Computing device 842 may also include input/output (I/O) controller 856 that can be operatively coupled to processor 857. (I/O) controller 856 can be integrated with processor 857 or it may be a separate component as shown. I/O controller 856 can generally be configured to control interactions with one or more I/O devices that may be coupled to the computing device 842, as for example input device 840 and orientation detector 855, such as an accelerometer. I/O controller 856 can generally operate by exchanging data between computing device 842 and I/O devices that desire to communicate with computing device 842.

Computing device 842 may also include display controller 858 that can be operatively coupled to processor 857. Display controller 858 can be integrated with processor 857 or it may be a separate component as shown. Display controller 858 can be configured to process display commands to produce text and graphics on display screen 860. By way of example, display screen 860 may be a monochrome display, color graphics adapter (CGA) display, enhanced graphics adapter (EGA) display, variable-graphics-array (VGA) display, super VGA display, liquid crystal display (e.g., active matrix, passive matrix and the like), cathode ray tube (CRT), plasma displays and the like. In the embodiment illustrated in FIG. 10, the display device corresponds to a liquid crystal display (LCD).

In some cases, processor 857 together with an operating system operates to execute computer code and produce and use data. The computer code and data can reside within program storage area 862 that may be operatively coupled to processor 857. Program storage area 862 can generally provide a place to hold data that may be used by computing device 842. By way of example, the program storage area may include Read-Only Memory (ROM), Random-Access Memory (RAM), hard disk drive and/or the like. The computer code and data could also reside on a removable program medium and loaded or installed onto the computing device when needed. In one embodiment, program storage area 862 can be configured to store information for controlling how the tracking and movement signals generated by the input device may be used, either alone or in combination for example, by computing device 842 to generate an input event command, such as a single button press for example.

Figure 15A:
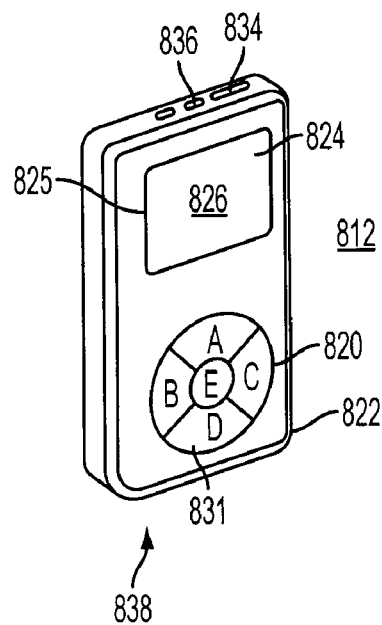
FIGS. 15A-15D illustrate examples of applications of input devices.
Figure 15B:
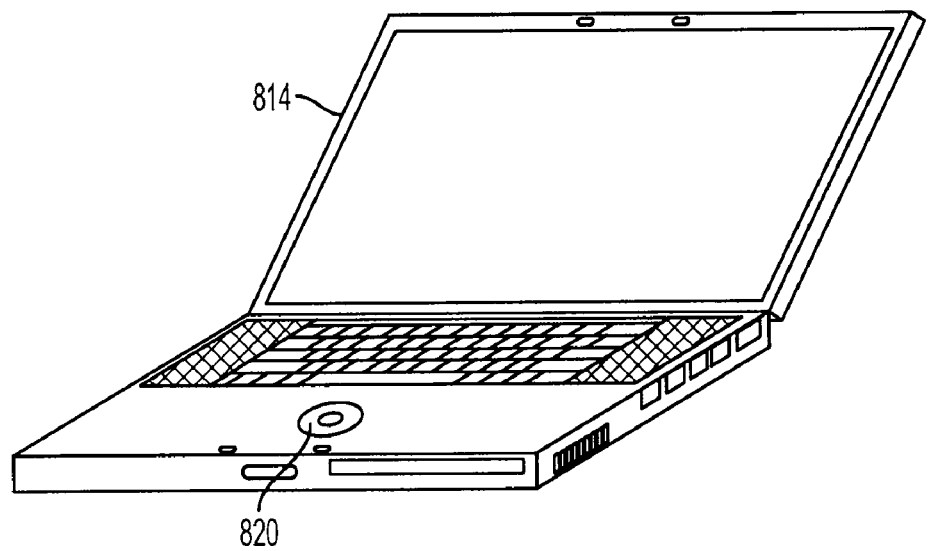
Figure 15C:
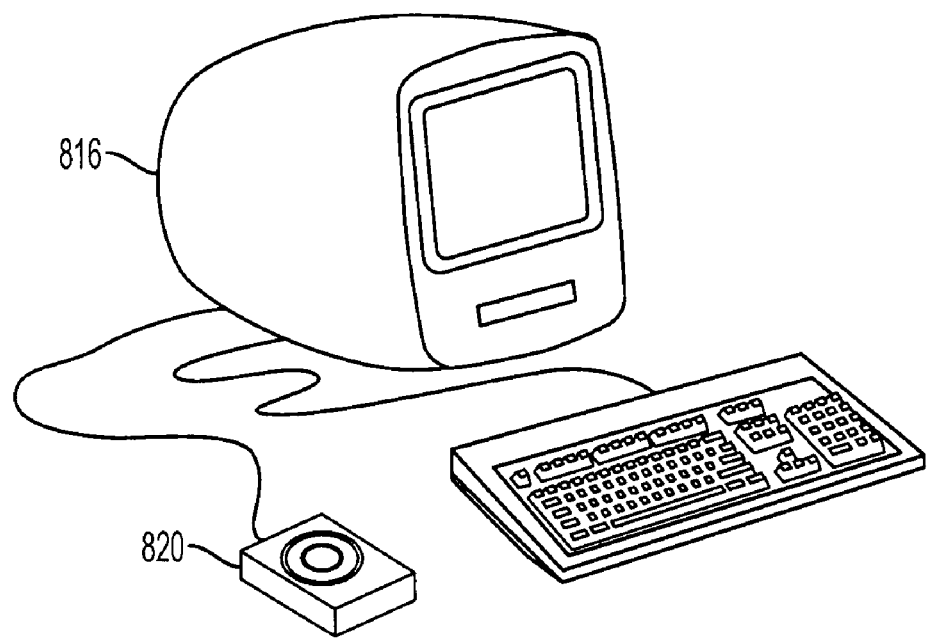
Figure 15D:
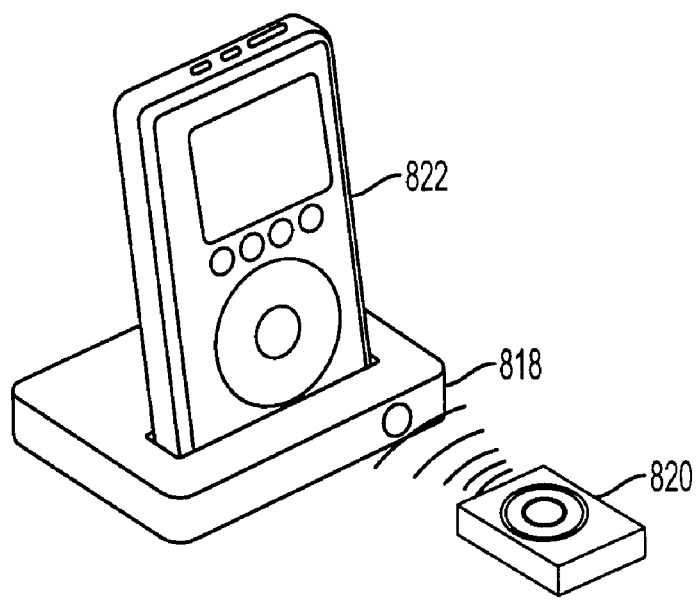

FIGS. 15A-15D illustrate applications of an input device according to some embodiments of the present disclosure. As previously mentioned, the input devices described herein can be integrated into an electronic device or they can be separate stand alone devices. FIGS. 15A-15D show some implementations of input device 820 integrated into an electronic device. FIG. 15A shows input device 820 incorporated into media player 812. FIG. 15B shows input device 820 incorporated into laptop computer 814. FIGS. 15C and 15D, on the other hand, show some implementations of input device 820 as a stand alone unit. FIG. 15C shows input device 820 as a peripheral device that can be connected to desktop computer 816. FIG. 15D shows input device 820 as a remote control that wirelessly connects to docking station 818 with media player 822 docked therein. It should be noted, however, that in some embodiments the remote control can also be configured to interact with the media player (or other electronic device) directly, thereby eliminating the need for a docking station. An example of a docking station for a media player may be found in U.S. patent application Ser. No. 10/423,490, entitled "Media Player System," filed Apr. 25, 2003, which is incorporated herein by reference in its entirety. It should be noted that these particular embodiments do not limit the present disclosure and that many other devices and configurations may be used.

Referring back to FIG. 15A, media player 812, housing 822 and display screen 824 may generally correspond to those described above. As illustrated in the embodiment of FIG. 15A, display screen 824 can be visible to a user of media player 812 through opening 825 in housing 822 and through transparent wall 826 disposed in front of opening 825. Although transparent, transparent wall 826 can be considered part of housing 822 since it helps to define the shape or form of media player 812.

Media player 812 may also include touch pad 820 such as any of those previously described. Touch pad 820 can generally consist of touchable outer surface 831 for receiving a finger for manipulation on touch pad 820. Although not illustrated in the embodiment of FIG. 15A, beneath touchable outer surface 831 a sensor arrangement can be configured in a manner as previously described. Information provided by the sensor arrangement can be used by media player 812 to perform the desired control function on display screen 824. For example, a user may easily scroll through a list of songs by swirling the finger around touch pad 820.

In addition to above, the touch pad may also include one or more movable buttons zones A-D as well as a center button E for example. The button zones can be configured to provide one or more dedicated control functions for making selections or issuing commands associated with operating media player 812. By way of example, in the case of an MP3 music player, the button functions can be associated with opening a menu, playing a song, fast forwarding a song, seeking through a menu, making selections and the like. In some embodiments, the button functions can be implemented via a mechanical clicking action.

The position of touch pad 820 relative to housing 822 may be widely varied. For example, touch pad 820 can be placed at any external surface (e.g., top, side, front, or back) of housing 822 accessible to a user during manipulation of media player 812. In some embodiments, touch sensitive surface 831 of touch pad 820 can be completely exposed to the user. In the embodiment illustrated in FIG. 15A, touch pad 820 can be located in a lower front area of housing 822. Furthermore, touch pad 820 can be recessed below, level with, or extend above the surface of housing 822. In the embodiment illustrated in FIG. 15A, touch sensitive surface 831 of touch pad 820 can be substantially flush with the external surface of housing 822.

The shape of touch pad 820 may also be widely varied. Although illustrated as circular in the embodiment of FIG. 15A, the touch pad can also be square, rectangular, triangular, and the like for example. More particularly, the touch pad can be annular, i.e., shaped like or forming a ring. As such, the inner and outer perimeter of the touch pad can define the working boundary of the touch pad.

Media player 812 may also include hold switch 834. Hold switch 834 can be configured to activate or deactivate the touch pad and/or buttons associated therewith for example. This can be generally done to prevent unwanted commands by the touch pad and/or buttons, as for example, when the media player is stored inside a user's pocket. When deactivated, signals from the buttons and/or touch pad cannot be sent or can be disregarded by the media player. When activated, signals from the buttons and/or touch pad can be sent and therefore received and processed by the media player.

Moreover, media player 812 may also include one or more headphone jacks 836 and one or more data ports 838. Headphone jack 836 can be capable of receiving a headphone connector associated with headphones configured for listening to sound being outputted by media player 812. Data port 838, on the other hand, can be capable of receiving a data connector/cable assembly configured for transmitting and receiving data to and from a host device such as a general purpose computer (e.g., desktop computer, portable computer). By way of example, data port 838 can be used to upload or download audio, video and other images to and from media player 812. For example, the data port can be used to download songs and play lists, audio books, ebooks, photos, and the like into the storage mechanism of the media player.

Data port 838 may be widely varied. For example, the data port can be a PS/2 port, a serial port, a parallel port, a USB port, a Firewire port and/or the like. In some embodiments, data port 838 can be a radio frequency (RF) link or optical infrared (IR) link to eliminate the need for a cable. Although not illustrated in the embodiment of FIG. 15A, media player 812 can also include a power port that receives a power connector/cable assembly configured for delivering power to media player 812. In some cases, data port 838 can serve as both a data and power port. In the embodiment illustrated in FIG. 15A, data port 838 can be a USB port having both data and power capabilities.

Although only one data port may be shown, it should be noted that this does not limit the present disclosure and that multiple data ports may be incorporated into the media player. In a similar vein, the data port can include multiple data functionality, i.e., integrating the functionality of multiple data ports into a single data port. Furthermore, it should be noted that the position of the hold switch, headphone jack and data port on the housing may be widely varied, in that they are not limited to the positions shown in FIG. 15A. They can be positioned almost anywhere on the housing (e.g., front, back, sides, top, bottom). For example, the data port can be positioned on the top surface of the housing rather than the bottom surface as shown.

Figure 16:
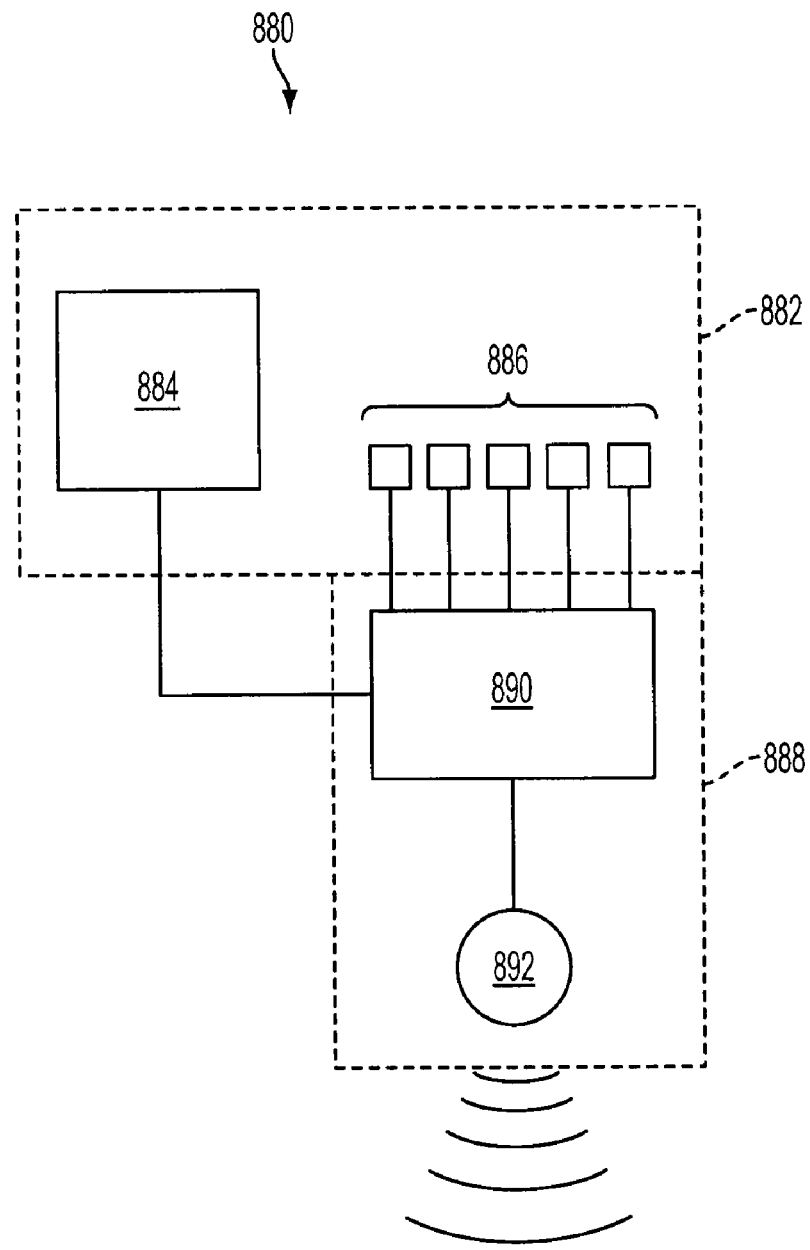
FIG. 16 illustrates an example of a remote control incorporating an input device.

FIG. 16 illustrates a simplified block diagram of a remote control incorporating an input device according to some embodiments of the present disclosure. By way of example, input device 882 may generally correspond to any of the previously described input devices. In this particular embodiment, input device 882 may correspond to the input device shown in FIGS. 12A-12C, thus the input device may include touch pad 884 and plurality of switches 886. Touch pad 884 and switches 886 can be operatively coupled to wireless transmitter 888. Wireless transmitter 888 can be configured to transmit information over a wireless communication link so that an electronic device that has receiving capabilities can receive the information over the wireless communication link. Wireless transmitter 888 may be widely varied. For example, it can be based on wireless technologies such as FM, RF, Bluetooth, 802.11 UWB (ultra wide band), IR, magnetic link (induction) and the like for example. In the embodiment illustrated in FIG. 16, wireless transmitter 888 can be based on IR. IR generally refers to wireless technologies that convey data through infrared radiation. As such, wireless transmitter 888 may generally include IR controller 890. IR controller 890 can take the information reported from touch pad 884 and switches 886 and convert this information into infrared radiation, as for example using light emitting diode 892.

It will be appreciated that the above description for clarity has described embodiments of the disclosure with reference to different functional units and processors. However, it will be apparent that any suitable distribution of functionality between different functional units or processors may be used without detracting from the disclosure. For example, functionality illustrated to be performed by separate processors or controllers may be performed by the same processors or controllers. Hence, references to specific functional units may be seen as references to suitable means for providing the described functionality rather than indicative of a strict logical or physical structure or organization.

The disclosure may be implemented in any suitable form, including hardware, software, firmware, or any combination of these. The disclosure may optionally be implemented partly as computer software running on one or more data processors and/or digital signal processors. The elements and components of an embodiment of the disclosure may be physically, functionally, and logically implemented in any suitable way. Indeed, the functionality may be implemented in a single unit, in a plurality of units, or as part of other functional units. As such, the disclosure may be implemented in a single unit or may be physically and functionally distributed between different units and processors.

One skilled in the relevant art will recognize that many possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to best utilize the disclosure and various embodiments with various modifications as suited to the particular use contemplated.

What is claimed is:

1. An input device comprising:
   a touch surface,
   a first conducting layer comprising a sensor configured to detect the movement of an object on or near the touch surface,
   a second conducting layer comprising a trace, and
   a third conducting layer comprising grounding and a connection to a touch surface movement detector, wherein the trace is coupled to at least one of the sensor and the movement detector.

2. The input device of claim 1, wherein the sensor is one of a plurality of sensors in a closed loop sensor arrangement.

3. The input device of claim 1, wherein the second conducting layer is located between the first conducting layer and the third conducting layer.

4. The device of claim 3, wherein at least one of the conducting layers is mounted on a flexible substrate.

5. The device of claim 4, further comprising a controller mounted on the flexible substrate.

6. The device of claim 1, wherein the touch surface movement detector comprises a mechanical switch.

7. The input device of claim 1, wherein the sensor comprises a capacitive sensor.

8. The input device of claim 1, wherein the trace is coupled to the sensor and the second layer comprises an additional trace coupled to the touch surface movement detector.

9. The input device of claim 1, wherein at least a portion of the input device comprises only two conducting layers.

10. The input device of claim 1, wherein at least a portion of the input device comprises only one conducting layer.

11. The input device of claim 1, wherein the input device is configured to accept a rotational input.

12. An input device comprising:
    a three conducting layer portion comprising a touch surface, a first conducting layer comprising a sensor configured to detect the movement of an object on or near the touch surface, a second conducting layer comprising a trace, and a third conducting layer comprising grounding and a connection to a touch surface movement detector, wherein the trace is coupled to at least one of the sensor and the movement detector, and
    a two conducting layer portion, the two conducting layer portion being configured to flex or bend.

13. The input device of claim 12, wherein the third layer comprises at least one connection to at least one touch surface movement detector.

14. The input device of claim 12, wherein the sensor comprises a capacitive sensor.

15. A portable hand-held device comprising:
    a housing,
       an input device mounted to the housing, the input device comprising:
       a touch surface,
       a first conducting layer comprising a plurality of sensors configured to detect a movement of an object on or near the touch surface, wherein the sensors are configured to accept a rotational input,
       a second conducting layer comprising a trace, and
       a third conducting layer comprising grounding and a connection to a touch surface movement detector, wherein the trace is coupled to at least one of the plurality of sensors and the movement detector,
    a battery inside the housing for powering the portable device, and
    a memory inside the housing for storing media items for playback by the portable device, wherein the input device can be used to select one of said media items.

16. The portable hand-held of claim 15, wherein the sensors are circumferentially arranged relative to a sensor area.

17. The portable hand-held of claim 15, wherein the touch surface movement detector is one of a plurality of touch surface movement detectors circumferentially arranged relative to the touch surface.

18. The portable hand-held device of claim 16, comprising a sensor or a movement detector mounted to a center portion of the sensor area.

19. The portable hand-held device of claim 15, wherein the sensors are configured to accept a gesture or multi-touch input.

20. The portable device of claim 15, further comprising a screen inside the housing for viewing media content.

* * * * *